US012683115B2

(12) United States Patent
Cattaneo et al.

(10) Patent No.: US 12,683,115 B2
(45) Date of Patent: Jul. 14, 2026

(54) ELECTRON SPECTROMETER CALIBRATION METHOD

(71) Applicant: ECOLE POLYTECHNIQUE FEDERALE DE LAUSANNE (EPFL), Lausanne (CH)

(72) Inventors: Paolo Cattaneo, Ecublens (CH); Fabrizio Carbone, Crans-Pres-Celigny (CH); Bruce Weaver, Lausanne (CH); Alexey Sapozhnik, Lausanne (CH); Thomas La Grange, St-Sulpice (CH); Yujia Yang, Ecublens (CH); Arslan Sajid Raja, Echandens-Denges (CH); Tobias Kippenberg, St-Sulpice (CH)

(73) Assignee: ECOLE POLYTECHNIQUE FEDERALE DE LAUSANNE (EPFL), Lausanne (CH)

(*) Notice: Subject to any disclaimer, the term of this patent is extended or adjusted under 35 U.S.C. 154(b) by 369 days.

(21) Appl. No.: 18/331,568

(22) Filed: Jun. 8, 2023

(65) Prior Publication Data

US 2023/0402250 A1      Dec. 14, 2023

(30) Foreign Application Priority Data

Jun. 10, 2022      (EP) .................................... 22178523

(51) Int. Cl.
*H01J 37/22*      (2006.01)
*H01J 37/05*      (2006.01)
(Continued)

(52) U.S. Cl.
CPC ............ *H01J 37/226* (2013.01); *H01J 37/20* (2013.01); *H01J 37/244* (2013.01); *H01J 37/28* (2013.01);
(Continued)

(58) Field of Classification Search
CPC ........ H01J 37/226; H01J 37/20; H01J 37/244; H01J 37/28; H01J 2237/24485;
(Continued)

(56) References Cited

U.S. PATENT DOCUMENTS 10,191,215 B2     1/2019   Kippenberg et al.
2024/0186102 A1*   6/2024   Dahan ................... H01J 37/147

FOREIGN PATENT DOCUMENTS

JP          2022549129 A  * 11/2022   ............. H01J 37/22
WO     WO-2018077471 A1 *  5/2018   ............ H01J 37/045

OTHER PUBLICATIONS

Translation of JP 2022549129 (Year: 2022).*
(Continued)

*Primary Examiner* — David E Smith
*Assistant Examiner* — Laura Eloise Tandy
(74) *Attorney, Agent, or Firm* — NIXON & VANDERHYE

(57)      ABSTRACT

The present invention concerns an energy dispersion calibration method for calibrating an electron spectrometer of an electron spectrometer system including at least one electron emission source, electron optics and the electron spectrometer. The method comprising:

obtaining, providing or receiving at least one electron energy loss spectrum produced by electrons of the electron spectrometer system exchanging energy with at least one resonant optical mode of an optical resonator into which light at a resonant wavelength is coupled;

calculating or providing a Fourier transform of the at least one electron energy loss spectrum or a part of the at least one electron energy loss spectrum;

determining or providing an energy dispersion ($\Delta E$) of the electron spectrometer according to the equation (Continued)

$$\Delta E = f_E \frac{hc}{\lambda N} \quad \text{or} \quad \Delta E = f_E \frac{E_p}{N}.$$

15 Claims, 9 Drawing Sheets

(51) Int. Cl.
    *H01J 37/20*        (2006.01)
    *H01J 37/244*     (2006.01)
    *H01J 37/28*       (2006.01)

(52) U.S. Cl.
    CPC .............. *H01J 2237/24485* (2013.01); *H01J 2237/2802* (2013.01)

(58) Field of Classification Search
    CPC ......... H01J 2237/2802; H01J 2237/057; H01J 2237/2826; H01J 37/05
    See application file for complete search history.

(56)          References Cited

OTHER PUBLICATIONS

Krivanek et al., "Monochromated STEM with a 30 meV-wide, atom-sized electron probe," Microscopy, vol. 62, No. 1, 2013, pp. 3-21.

Webster et al., "Correction of EELS dispersion non-uniformities for improved chemical shift analysis," Ultramicroscopy, vol. 217, 2020, 113069, pp. 1-7.

Batson et al., "A new technique for the scanning and absolute calibration of electron energy loss spectra," Ultramicroscopy, vol. 6, 1981, pp. 287-290.

Potapov et al., "Measuring the absolute position of EELS ionisation edges in a TEM," Ultramicroscopy, vol. 99, 2004, pp. 73-85.

Kothleitner et al., "Linking TEM Analytical Spectroscopies for an Assumptionless Compositional Analysis," Microscopy and Micro-analysis, vol. 20, 2014, pp. 678-686.

Egerton, "Electron Energy Loss Spectroscopy in the Electron Micro-scope," Springer, 3rd ed. New York, 2011, 498 pages.

Krivanek et al., "Progress in ultrahigh energy resolution EELS," Ultramicroscopy, vol. 203, 2019, pp. 60-67.

Ted Pella. Inc., "Evaluating an Analytical TEM with the NIOX™ Test Specimen, Product No. 650," 2019, 7 pages, https://www.tedpella.com/technote_html/650%20TN.pdf.

Henke et al., "Integrated photonics enables continuous-beam elec-tron phase modulation," Nature, vol. 600, Dec. 2021, arXiv:2105.03729v2, 2021, pp. 653-658.

Pfeiffer et al., "Photonic Damascene process for integrated high-Q microresonator based nonlinear photonics," Optica, vol. 3, No. 1, Jan. 2016, pp. 20-25.

Liu et al., "High-yield, wafer-scale fabrication of ultralow-loss, dispersion-engineered silicon nitride photonic circuits," Nature Com-munications, vol. 12, 2021, pp. 1-9.

* cited by examiner (b)
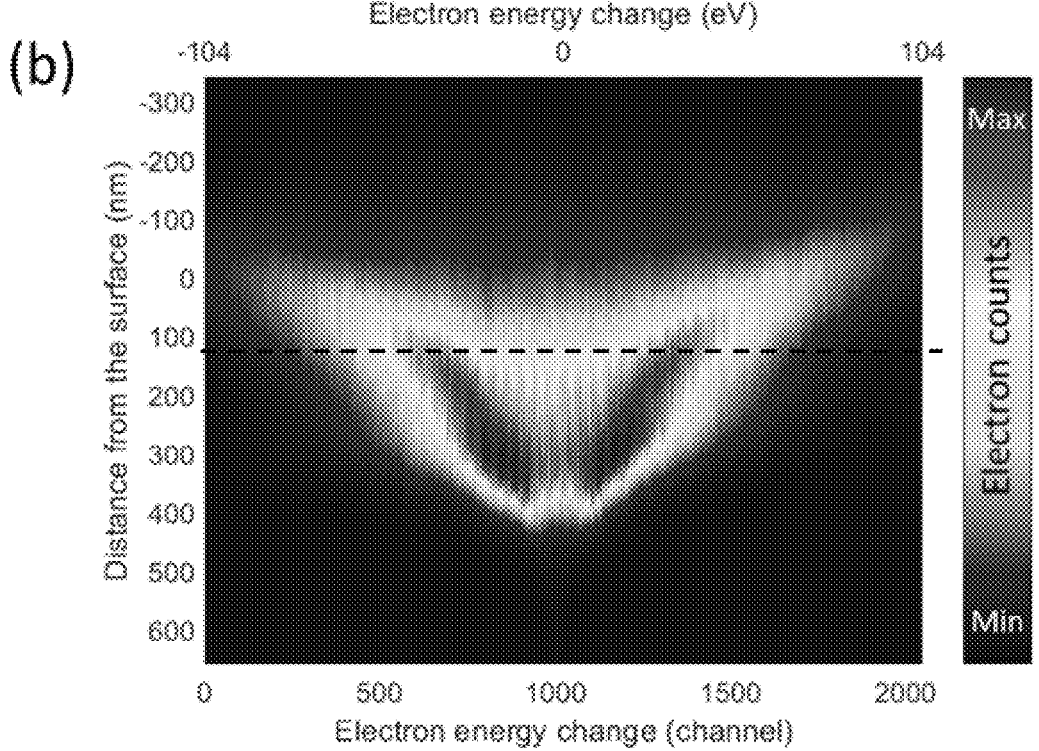
FIGURE 1B
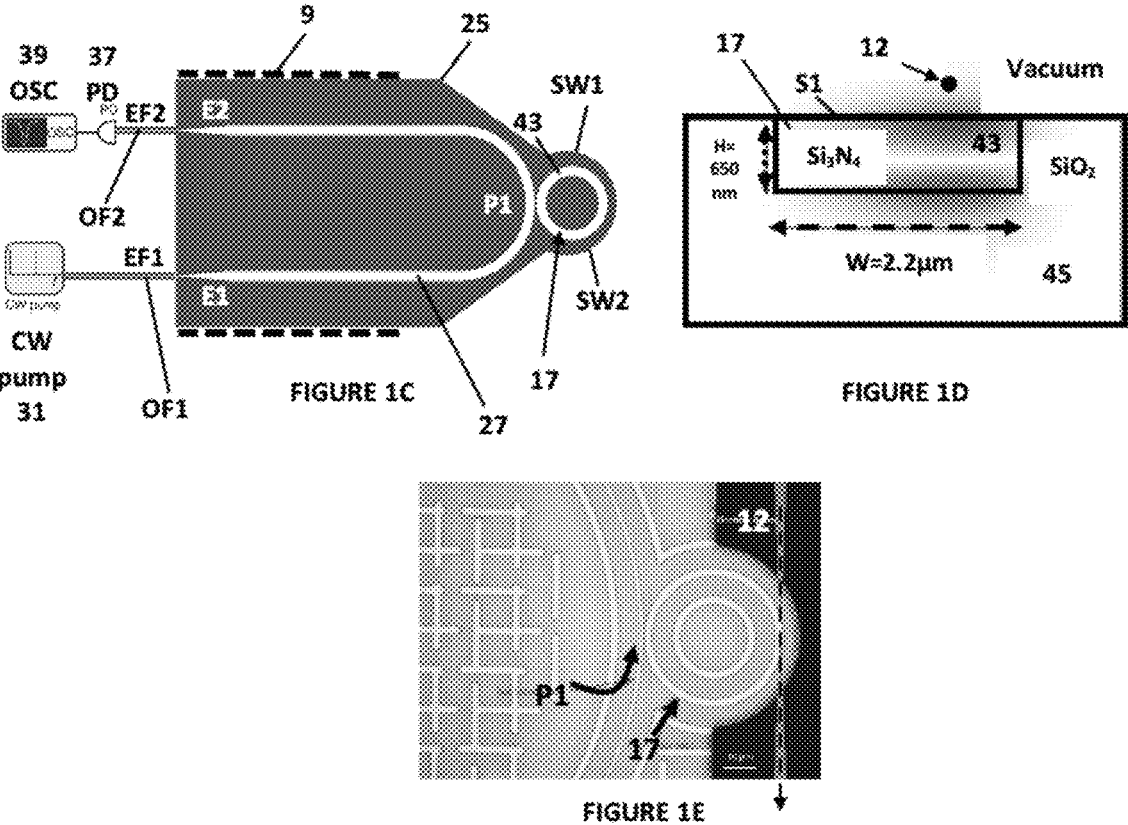
FIGURE 1C
FIGURE 1D
FIGURE 1E (a)

(b)

(a)

(b)

(a)

(b)

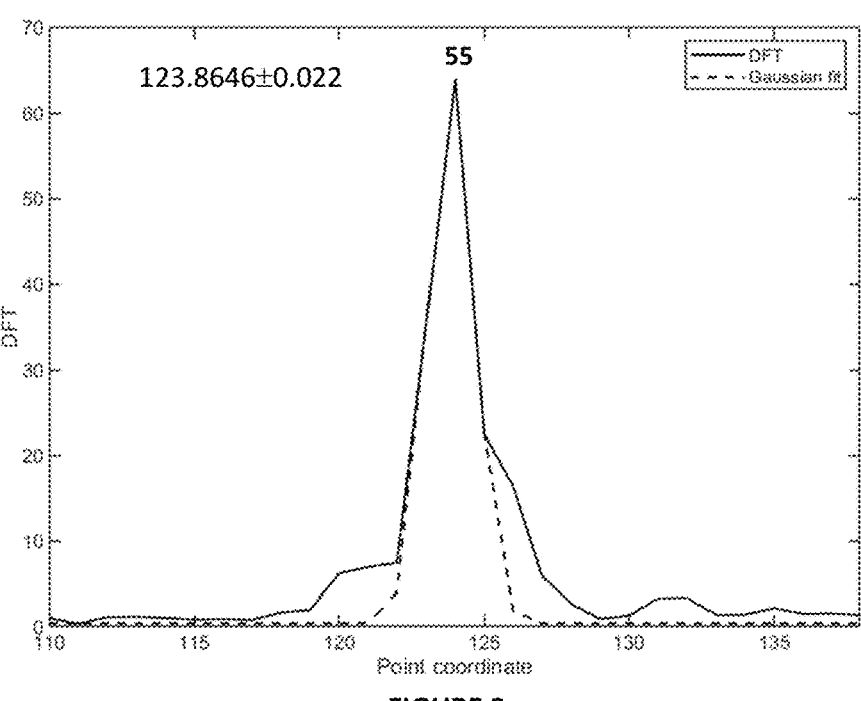

FIGURE 9

| Scan laser wavelengths using the optical spectrometer to find the resonant wavelength by looking at the power transmitted by the bus waveguide with the oscilloscope. Resonance is identified by a decrease in the transmitted power |
| --- |

↓

| Acquire the EELS 2D map with the electron spectrometer |
| --- |

↓

| Select a pixel along the vertical axis and plot a single EEL spectrum |
| --- |

↓

| Compute the FFT of the selected EEL spectrum |
| --- |

↓

| Compute a Gaussian fit of the side peak in the FFT. Determine the mean M and its 95% confidence interval |
| --- |

↓

Compute the energy dispersion as: $\Delta E = \frac{Ep}{N} M$, where $Ep$ is the photon energy, $N$ is the number of points in the EEL spectrum, $M$ is the number of points between the center of the side peak and the zero of the horizontal axis in the DFT. The relative error on the dispersion is $\frac{\varepsilon(\Delta E)}{\Delta E} = \sqrt{\left(\frac{\delta M}{M}\right)^2 + \left(\frac{\delta\lambda}{\lambda}\right)^2}$

ELECTRON SPECTROMETER CALIBRATION METHOD

CROSS-REFERENCE TO RELATED APPLICATIONS

This application claims priority to EP Patent Application No. 22178523.1 filed Jun. 10, 2022, the entire contents of which is hereby incorporated by reference.

FIELD OF THE INVENTION

The present invention relates to electron microscopes and electron spectrometers thereof, and in particular to electron energy loss spectroscopy calibration of dispersion and non-linearities of electron spectrometers, such electron spectrometers being included, for example, in systems comprising a transmission electron microscope TEM, or any system containing an electron source device and an associated electron spectrometer.

BACKGROUND

Probing low-energy excitations and collective modes of crystalline solids, nanostructures, and molecules is challenging for high-energy probes such as fast electrons in Transmission Electron Microscopes (TEM) or X-rays from synchrotrons and free-electron lasers. In recent years, much progress has been achieved in developing high-energy resolution electron optics to detect the spectroscopic features only a few tens of meV away from the elastic peak in TEMs. Quantifying loss energy associated with collective phonons, bandgaps, and excitonic states depends on the calibration of the absolute energy scale of the spectrometer.

The energy calibration of electron spectrometers is highly sensitive to ambient conditions, such as the temperature and the humidity, the hysteresis of the magnetic lenses, and the electromagnetic noise in the microscope room. Therefore, the most reliable approach for performing high-resolution electron spectroscopy studies preferably involves verifying the calibration of the spectrometer before each measurement. Different techniques have been proposed in the last decades. However, a standardized approach that enables a quick calibration procedure and outstanding precision is still missing.

Generally, the dispersion calibration of the spectrometer can be done in two ways. The first approach is based on utilizing a material with a known ionization edge energy. These edges can be used as energy references in the spectrum. The second approach relies on measuring the zero-loss peak (ZLP) displacement while changing the voltage of the drift tube of the spectrometer by a known value. The shift of the ZLP corresponds to the drift tube voltage and is used for energy dispersion calibration. The limitations of these techniques originate from the instability of the energy of the primary electrons, the variations of the core-loss peak energies due to chemical shifts, as well as the accuracy and stability of the power supplies used for generating the drift tube voltage.

Consequently, a standardized calibration technique providing improved accuracy is highly desirable for high-resolution electron spectroscopy such as high-resolution electron energy-loss spectroscopy (EELS).

SUMMARY OF THE INVENTION

The present invention addresses the above-mentioned limitations by providing a calibration method.

The present invention provides an energy dispersion calibration method for calibrating an electron spectrometer of an electron spectrometer system. The electron spectrometer system includes, for example, at least one electron emission source, electron optics and the electron spectrometer. The method, for example, comprises:

obtaining, providing or receiving at least one electron energy loss spectrum produced by electrons of the electron spectrometer system exchanging energy with at least one resonant optical mode of an optical resonator into which light at a resonant wavelength is coupled;

calculating or providing a Fourier transform FT of the at least one electron energy loss spectrum or a part of the at least one electron energy loss spectrum;

determining or providing an energy dispersion $\Delta E$ of the electron spectrometer according to the equation $$\Delta E = f_E \frac{hc}{\lambda N} \text{ or } \Delta E = f_E \frac{E_p}{N}$$

where $\lambda$ is the resonant wavelength of the light coupled into the optical resonator, h is Planck's constant, c being is the speed of light in vacuum, $E_p$ is the resonant photon energy of the light coupled into the optical resonator, N is the number of channels or data points along an energy axis of the at least one electron energy loss spectrum used in determining the Fourier transform FT of the at least one electron energy loss spectrum or a part thereof, and $f_E$ is the number of reciprocal energy space data points or coordinates between (i) a DC spectral component peak of the Fourier transform FT of the at least one electron energy loss spectrum or a part thereof and (ii) a sideband peak or a center of a sideband peak of the Fourier transform FT of the at least one electron energy loss spectrum or a part thereof, the sideband peak originating from electron energy exchange with the at least one resonant optical mode of the optical resonator.

A center of the sideband peak may be determined by fitting the sideband peak with a peak fitting function or functions, the center of the sideband peak being determined to be the center of the peak of the fitted peak fitting function.

The method may further include determining and/or providing an accuracy or error value ($\delta\Delta E$) of the energy dispersion ($\Delta E$) determined according to the equation $$\delta\Delta E = \sqrt{\left(\frac{\delta f_E}{f_E}\right)^2 + \left(\frac{\delta\lambda}{\lambda}\right)^2} \cdot \Delta E$$

where $\Delta E$ is the energy dispersion, $\delta\lambda$ is an accuracy or error value of the wavelength value or wavelength measurement of the resonant wavelength of the light coupled into the optical resonator $\lambda$, and $\delta f_E$ is an accuracy or error value of a determined center of the side peak $f_E$ of the Fourier transform FT of the at least one electron energy loss spectrum or a part thereof.

An accuracy or error value $\delta f_E$ of a determined position of a center of the side peak 55 is determined, for example, as half of the width of a confidence interval of the mean value of the peak fitting function.

The confidence interval may be set to be between a 90% confidence interval and a 99% confidence interval or a 90% to 99% confidence level, or the confidence interval may be a 95% confidence interval or at a 95% confidence level.

The method may further include determining spectrometer or system calibration nonlinearities by calculating and/ or providing a Fourier transform FT of a plurality of spectral subsets or spectral windows of the at least one electron energy loss spectrum by displacing at least one spectral subset or spectral window across the at least one electron energy loss spectrum, and determining an energy dispersion $\Delta E$ of channels within each of the plurality of spectral subsets or spectral windows to determine an energy dispersion $\Delta E$ of a plurality of different regions across the channels of the electron spectrometer.

The method may further include applying a nonlinearity calibration correction to the determined energy dispersion $\Delta E$ of the electron spectrometer, the calibration nonlinearity correction being based on the determined energy dispersion $\Delta E$ of the plurality of different regions across the channels of the electron spectrometer, the nonlinearity calibration correction including a calibration that compensates for nonlinearities of the system.

The electron spectrometer system may be set at a specific electron energy for exchanging energy between an electron and light propagating in the optical resonator.

The electron velocity may be matched with a phase velocity of the light resonating in the optical resonator.

An alignment of the electron spectrometer system may be carried out to concentrate the electron beam in the vicinity of the optical resonator in which an optical power contained therein creates an electron energy loss spectrum containing a plurality of sideband peaks populating the entire range of the spectrometer energy scale to assure higher precision of dispersion calibration and determination of the spectrometer non-linearities.

The method may include providing an optical resonator for exchanging energy with electrons of the electron spectrometer system or a transmission electron microscope.

The method may further include providing an optical device holder configured to hold or holding the optical resonator.

The method may further include providing a calibration device or system including the optical device holder configured to hold or holding the optical resonator, at least one optical waveguide for providing light to the optical resonator, optical wavelength determination means and resonance wavelength determination means configured for determining wavelength matching of light coupled to the optical resonator with a resonance wavelength or mode of the optical resonator.

The method may further include providing at least one light source, at least one controller, at least one computing means, and a computer program including program instructions, which when executed by the at least one computing means cause the at least one controller:

to adjust a wavelength generated by the at least one light source, monitor or process data or a signal representative of a light intensity signal provided to the optical resonator, and identify or determine a decrease in the light intensity signal or a signature representing a reduction in the optical power representing a resonance condition at which a wavelength of light coupled to the optical resonator matches a resonance wavelength or mode of the optical resonator.

A further aspect of the present invention concerns a computer program comprising instructions which, when the program is executed by a computer, cause the computer to carry out the above method.

Yet a further aspect of the present invention concerns an electron spectrometer system or calibration system including the computer program.

The electron spectrometer system or calibration system may, for example, further include a calibration device or system including an optical device holder configured to hold or holding the optical resonator, at least one optical waveguide for providing light to the optical resonator, optical wavelength determination means and resonance wavelength determination means configured for determining wavelength matching of light coupled to the optical resonator with a resonance wavelength or mode of the optical resonator.

The electron spectrometer system or calibration system may, for example, further include at least one light source, at least one controller, at least one computing means, and a computer program including program instructions, which when executed by the at least one computing means cause the at least one controller:

to adjust a wavelength generated by the at least one light source, monitor or process data or a signal representative of a light intensity signal provided to the optical resonator, and identify or determine a decrease in the light intensity signal or a signature representing a reduction in the optical power representing a resonance condition at which a wavelength of light coupled to the optical resonator matches a resonance wavelength or mode of the optical resonator.

The method of the present disclosure for calibrating electron spectrometers such as electron-energy loss spectrometers in, for example, transmission electron microscopes is based on the interaction between continuous-wave near fields and electrons and, therefore, can be implemented in every conventional transmission electron microscope (TEM). The method of the present disclosure assures a significantly higher calibration precision reaching $\mu eV$/ channel.

Moreover, it additionally allows for monitoring of the linearity of the spectrometer calibration across a spectrometer sensor, which is not readily available with other known calibration methods.

The method of the present disclosure provides a standardized technique for quick calibration of electron spectrometers for high-resolution electron spectroscopy, such as high-resolution electron energy-loss spectroscopy (EELS). The method of the present disclosure improves the calibration precision down to (about) 15 $\mu eV$/channel, allowing for high-resolution EELS measurements.

A strong interaction between relativistic electrons in, for example, the TEM and confined optical modes in an integrated microresonator provides an electron energy loss spectrum that is exploited to calibrate energy dispersion. This is achieved through a high-Q microresonator that provides an enhancement of the optical near-field to assure strong electron-photon interaction. A resonant optical mode of the microresonator is excited while being located, for example, inside the TEM column. A specifically designed (TEM) sample holder allows optical fibers to enter the TEM column and provide laser light to the microresonator.

A phase-matched interaction of electrons with light circulating in a (ring) optical resonator in, for example, a TEM provides an inelastic interaction with the electrons and leads to the exchange of an integer number of photons. The resulting equally-spaced subbands or peaks generated in the spectrum of the interacting electrons can be used as a very precise measure for calibrating the energy axis of the electron spectrometer. The calibration method is readily applicable to any modern electron microscope.

The method of the present disclosure allows to obtain an absolute energy calibration of the entire range of electron spectrometer (up to three decades) and characterize its nonlinearities with an accuracy of a few micro-electron volt with a single acquisition.

The method of the present disclosure is a novel application of microresonator-based CW-PINEM (continuous wave photon-induced near-field electron microscopy) for the calibration of electron energy loss spectrometers with μeV per channel accuracy and precision. Equally-spaced sidebands generated in the process provide an approach for broadband, precise calibration of dispersion of an electron energy spectrometer. The method additionally allows for quantifying the nonlinearity of the spectrometer calibration, permitting its subsequent correction.

This calibration approach can be implemented into an integrated solution and is practical for routinely calibrating the TEM spectrometers. Furthermore, other techniques require long and multiple acquisitions, which are susceptible to errors and uncertainties resulting from spectrum drift, beam instabilities, and environmental factors. The method of the present disclosure does not suffer from such errors since calibration can be performed with a spectrum from a single millisecond acquisition. The possibility to correct nonlinearities and calibrate the dispersion with significantly improved accuracy and precision will be highly beneficial for high-resolution electron energy-loss spectroscopy (EELS) measurements, including vibrational spectroscopy and core-loss EELS measurements of chemical shifts for elemental analysis.

The above and other objects, features, and advantages of the present invention and the manner of realizing them will become more apparent, and the invention itself will best be understood from a study of the following description with reference to the attached drawings showing some preferred embodiments of the invention.

A BRIEF DESCRIPTION OF THE SEVERAL VIEWS OF THE DRAWINGS

FIG. 1A shows an exemplary system for calibrating spectrometer energy dispersion of an electron spectrometer of an electron microscope. The magnified section shows the interaction region where the electron beam is tightly focused (for example, in nano-beam mode) close to the outer surface of the optical resonator (for example, in the order of a few nm). The optical cavity modes of the optical resonator are also illustrated.

FIG. 1B shows an electron energy spectral map of electrons that have interacted with the electric field of the optical resonator. In this example, the cavity mode wavelength is 1549.0 nm. The vertical scale corresponds to the distance in a direction normal to the optical resonator's outer surface. The horizontal axis corresponds to the electron energy change. The top horizontal scale is represented in eV relative to the zero-loss peak (ZLP) located at the 1025th channel using a nominal dispersion of 100 meV/channel.

FIG. 1C schematically shows an optical device including an optical resonator and a coupling or bus waveguide configured to couple light into the optical resonator.

Figure 1A:
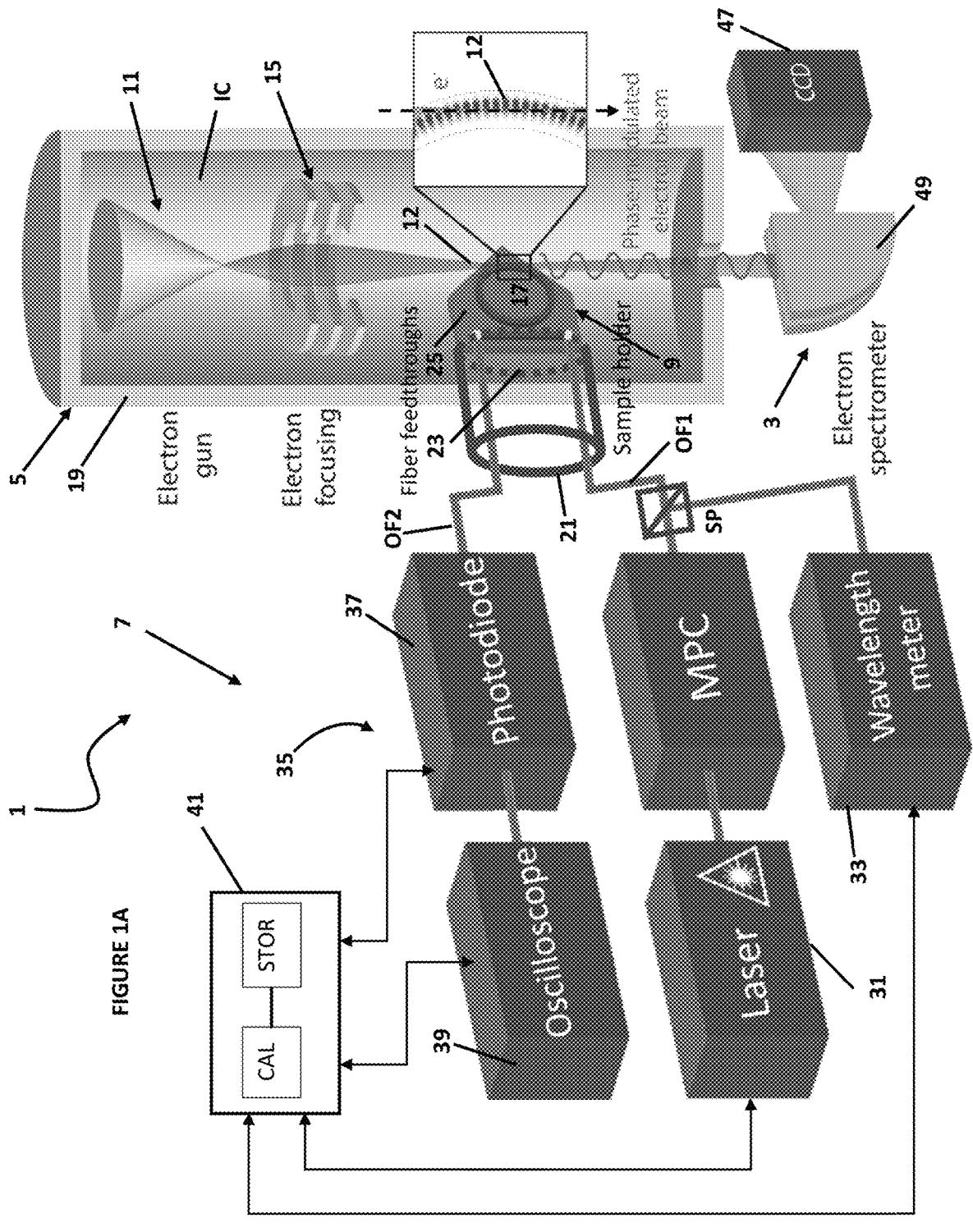
FIG. 1D is a cross-sectional schematic of an optical resonator and an electron beam extending parallel to the optical resonator (perpendicularly out of the page).
FIG. 1E shows a top view image of an optical resonator and an electron beam extending parallel to the outer surface of the optical resonator (dashed arrow added to indicate electron beam direction).
Figure 1F:
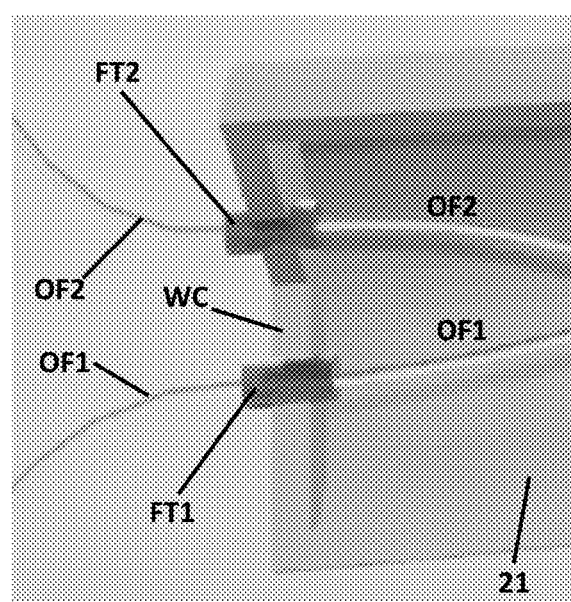

FIG. 1F schematically shows a first and a second vacuum fiber feedthrough through which optical fibers exit the controlled vacuum environment of the TEM.

Figures 2A, 2B, 2C:
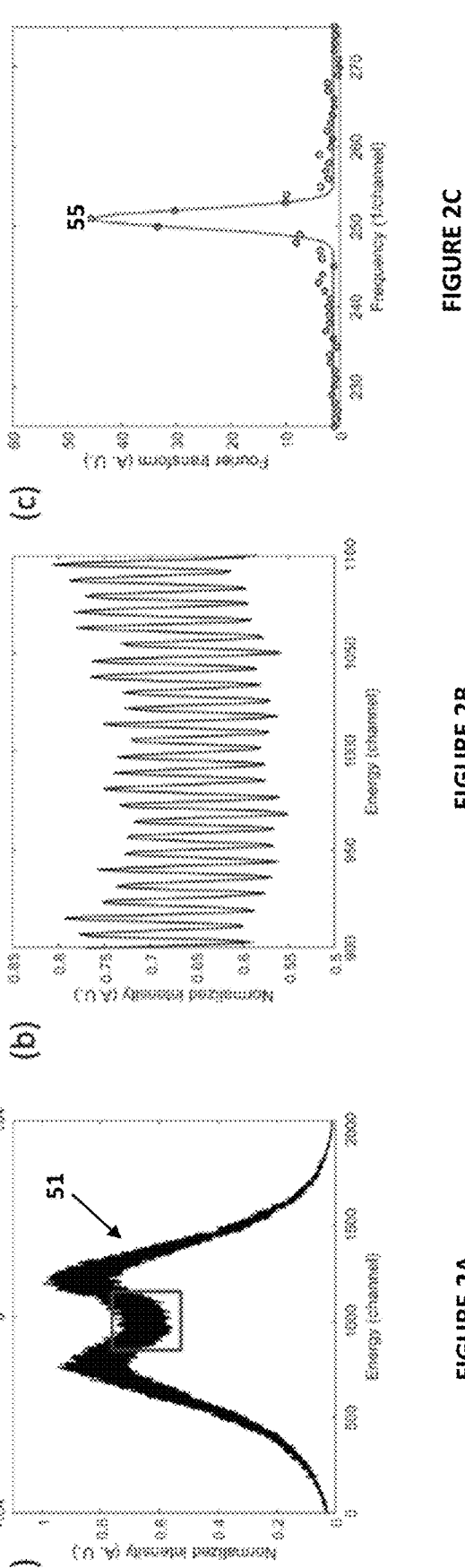

FIG. 2A shows the electron spectrum (electron energy loss spectrum) taken as the cross-section of the 2D map shown in FIG. 1B at a distance of 120 nm from the microresonator surface (approximately at the dashed line shown in FIG. 1B merely as a visual aide).

FIG. 2B shows an enlarged part of the electron spectrum, as indicated by the rectangle in FIG. 2A. The equidistant photon sidebands or peaks are visible and were used as a reference for the energy dispersion calibration of the electron spectrometer.

FIG. 2C shows a windowed Fourier Transform (FT) of the electron spectrum of FIG. 2A (black circle data points). The solid line is a fit of the FT peak with a Gaussian function.

Figure 3A:
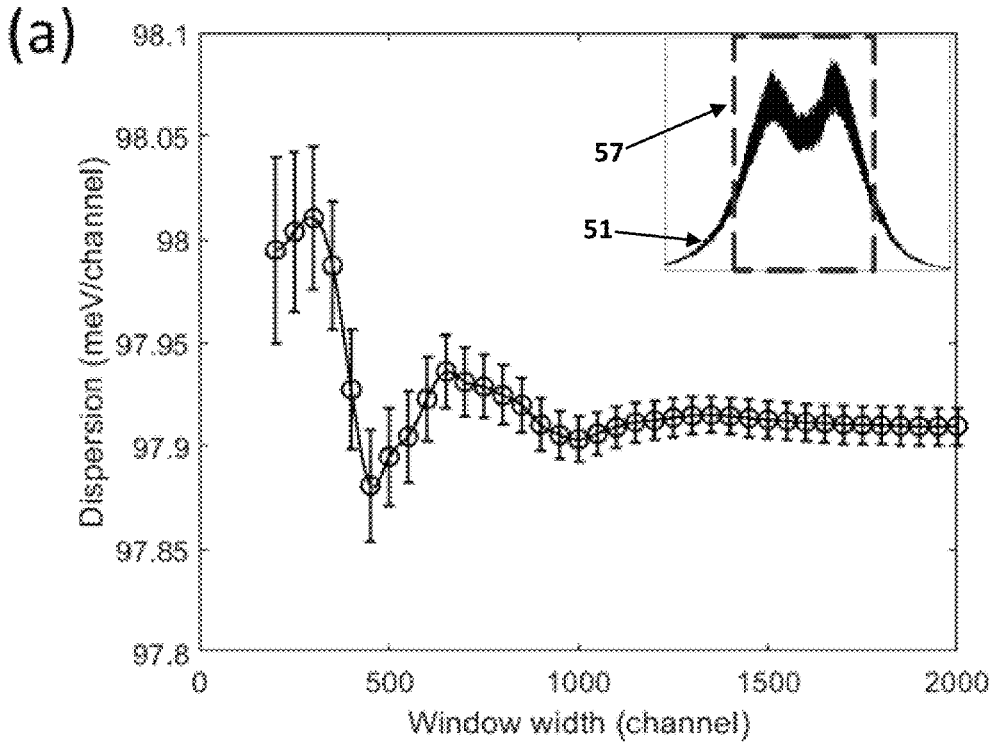

FIG. 3A shows the spectrometer energy dispersion obtained from the windowed Fourier Transform (FT) of the electron spectrum of FIG. 2A utilizing windows of different widths at the central part of the spectrum. The inset displays a window with an exemplary width of 1000 channels (dashed box). The solid line is included as a guide for the eye.

Figure 3B:
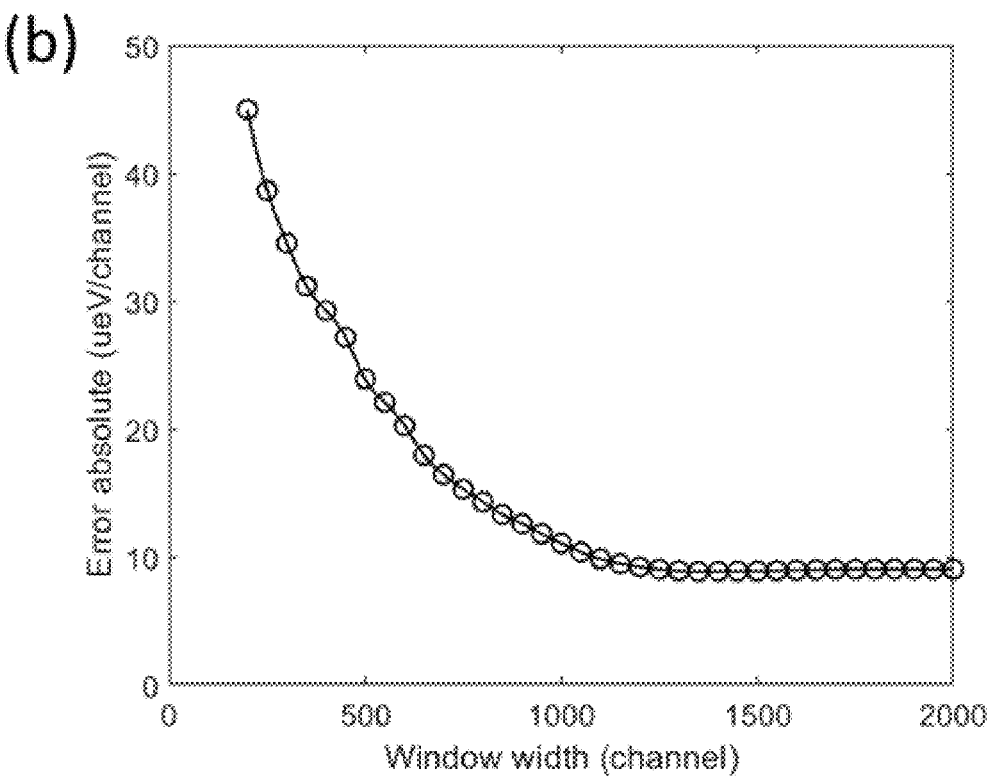

FIG. 3B shows the window width dependence of the absolute error of the determined energy dispersion. The solid line is included as a guide for the eye.

Figure 4A:
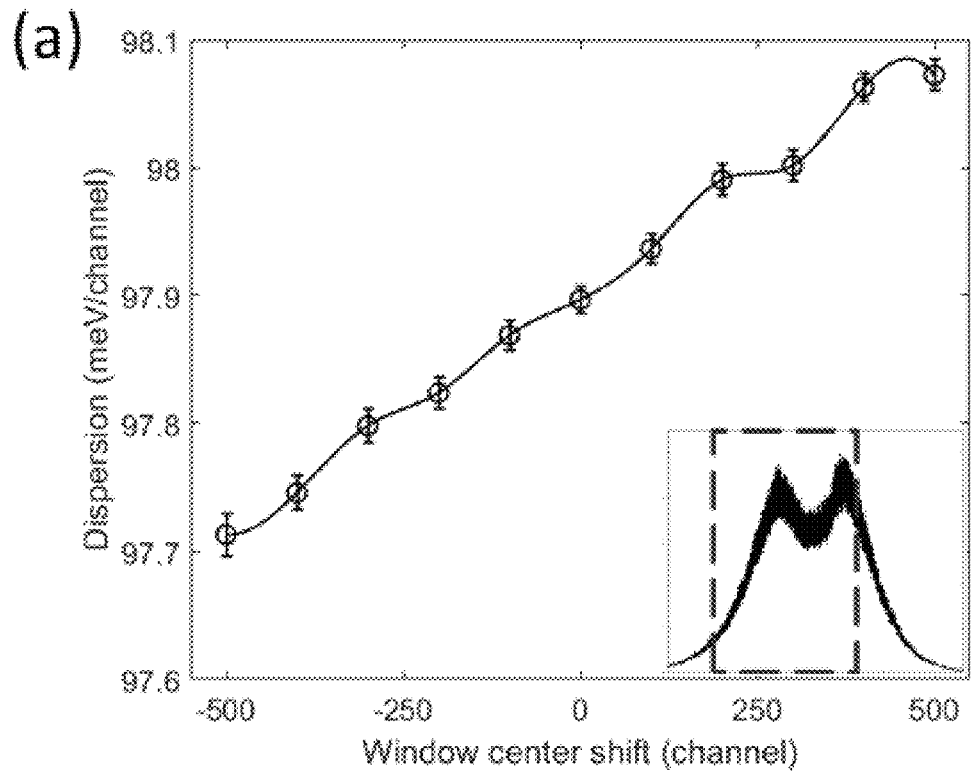

FIG. 4A shows the channel-resolved energy dispersion across the CCD sensor/camera calculated for each window center position, showing an inhomogeneous energy dispersion across the camera. The inset displays an exemplary window of 1000 channels shifted from the center of the spectrum by 250 channels. The solid line is included as a guide for the eye.

Figure 4B:
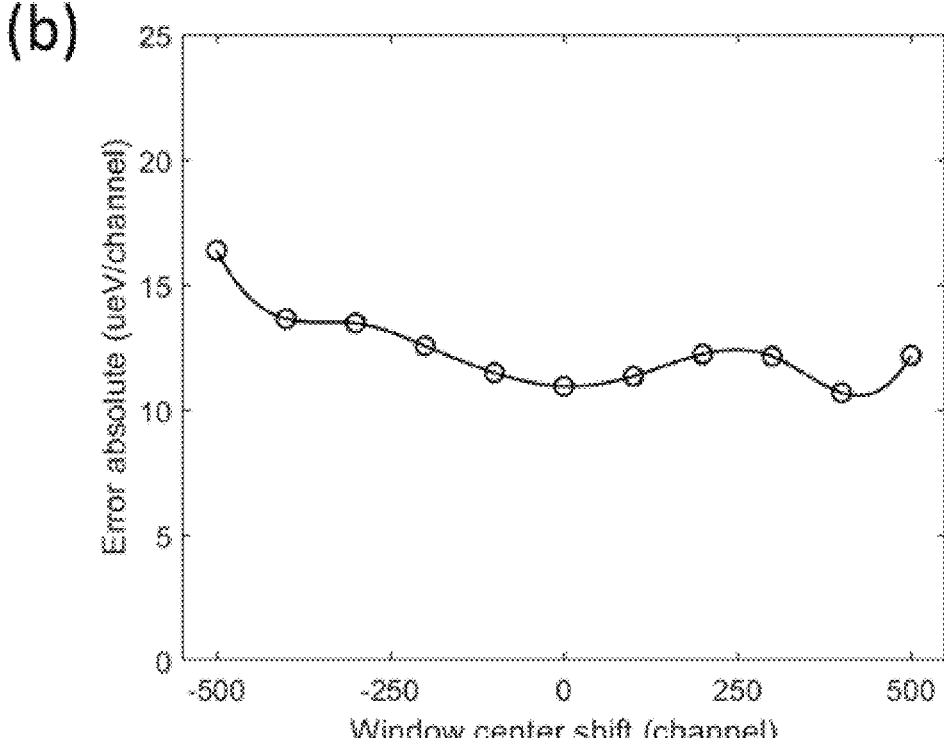

FIG. 4B shows the absolute error of the calibration as the function of the window center. The solid line is included as a guide for the eye.

Figure 5A:
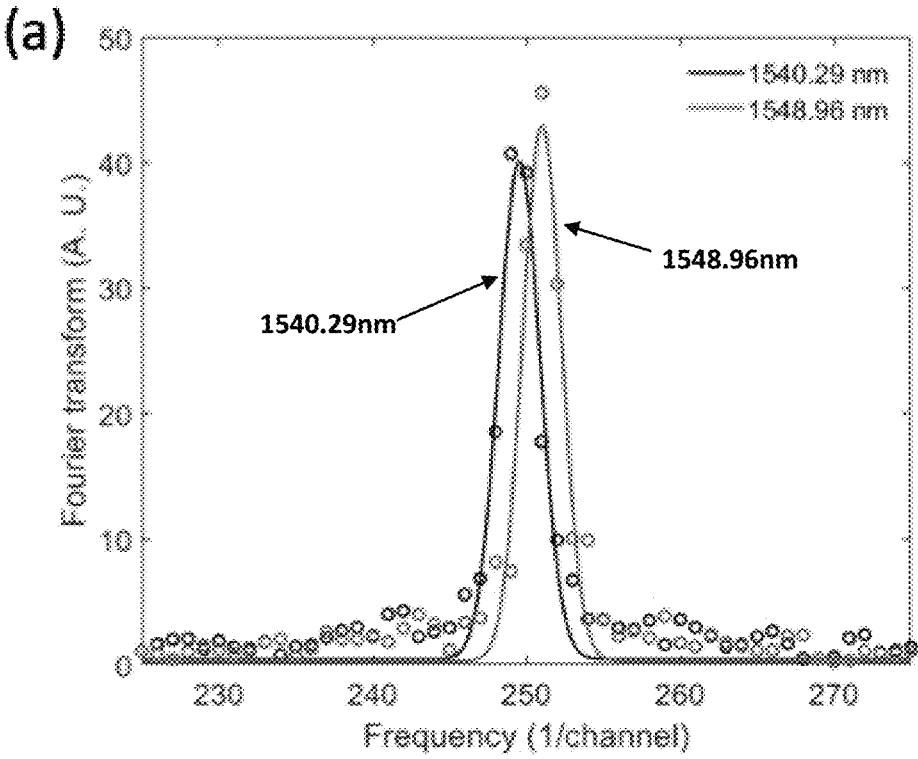

FIG. 5A shows the windowed Fourier Transform (FT) of the electron spectrum measured at a laser wavelength of 1540.3 nm (left peak) and 1549.0 nm (right peak), which was used to calibrate the electron spectrometer.

Figure 5B:
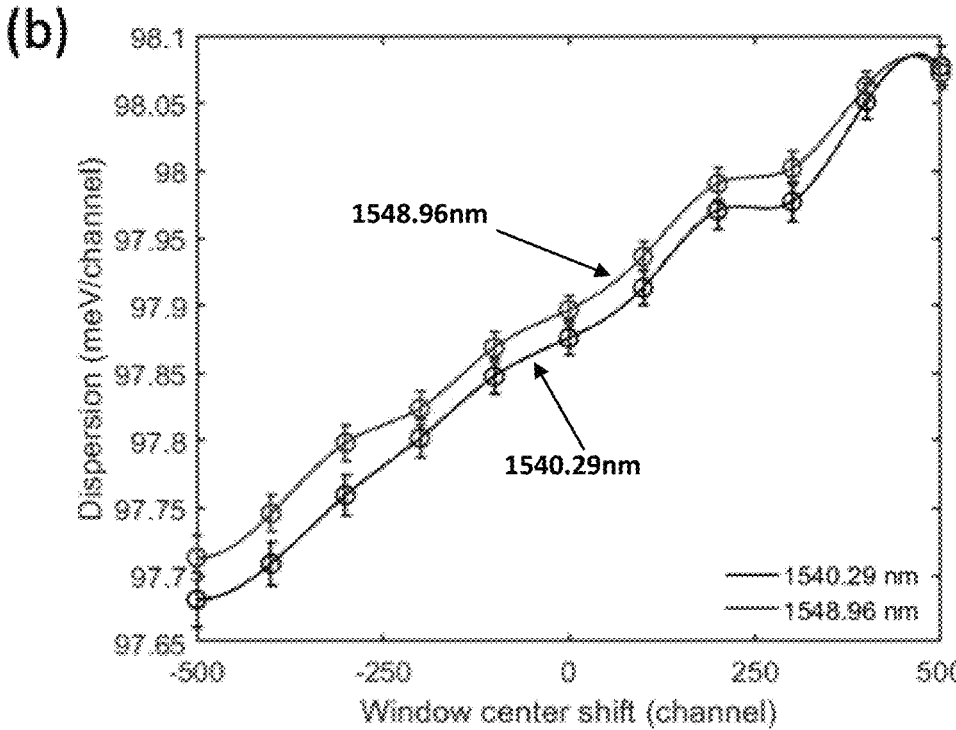

FIG. 5B shows a comparison of the energy dispersion calibration measured using an exemplary window of 1000 channels at two resonant wavelengths of the optical cavity.

Figure 6:
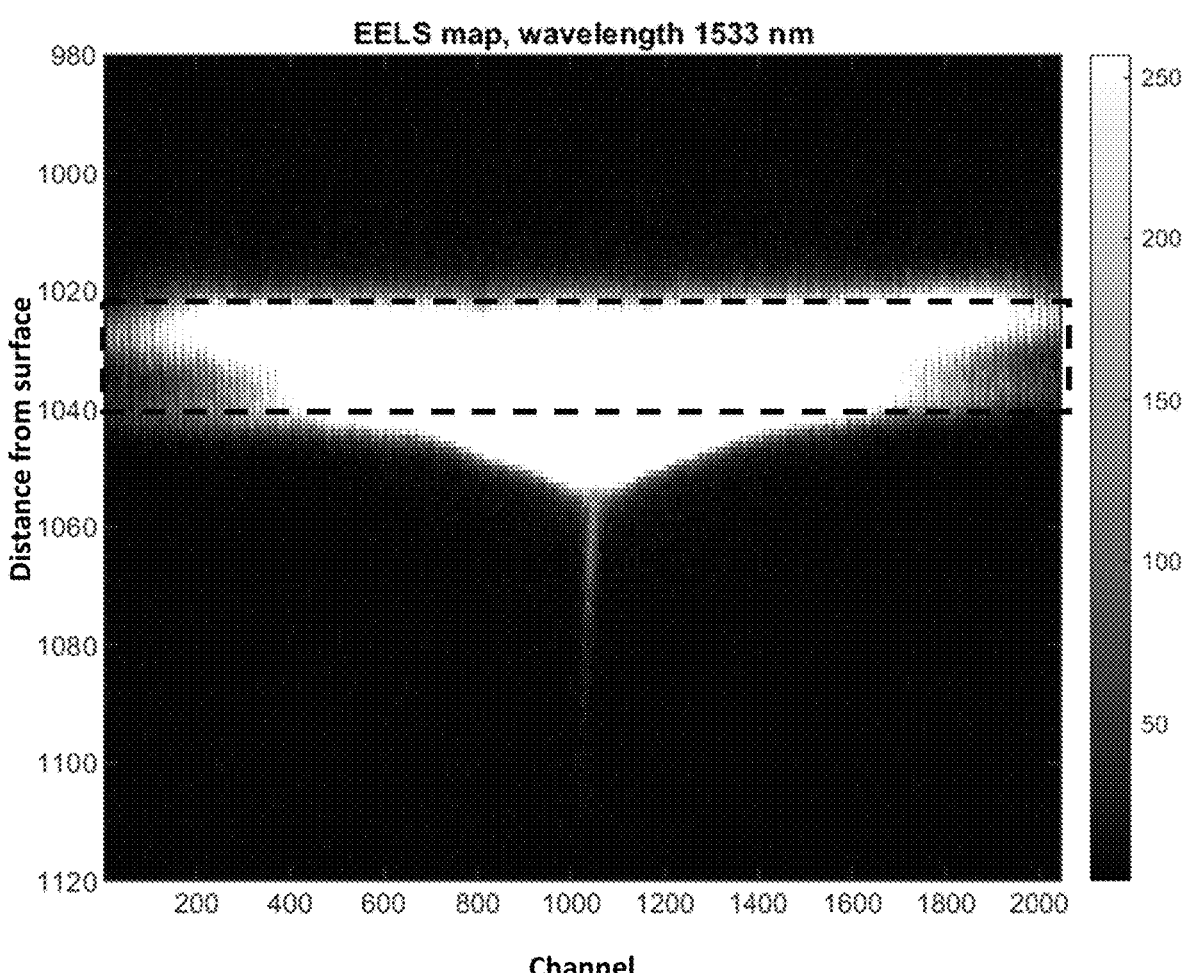

FIG. 6 shows a further exemplary 2D electron energy spectral map of electrons that have interacted with the electric field of the optical resonator, measured by the electron spectrometer for a resonant mode of the microresonator at 1531.7 nm.

Figure 7:
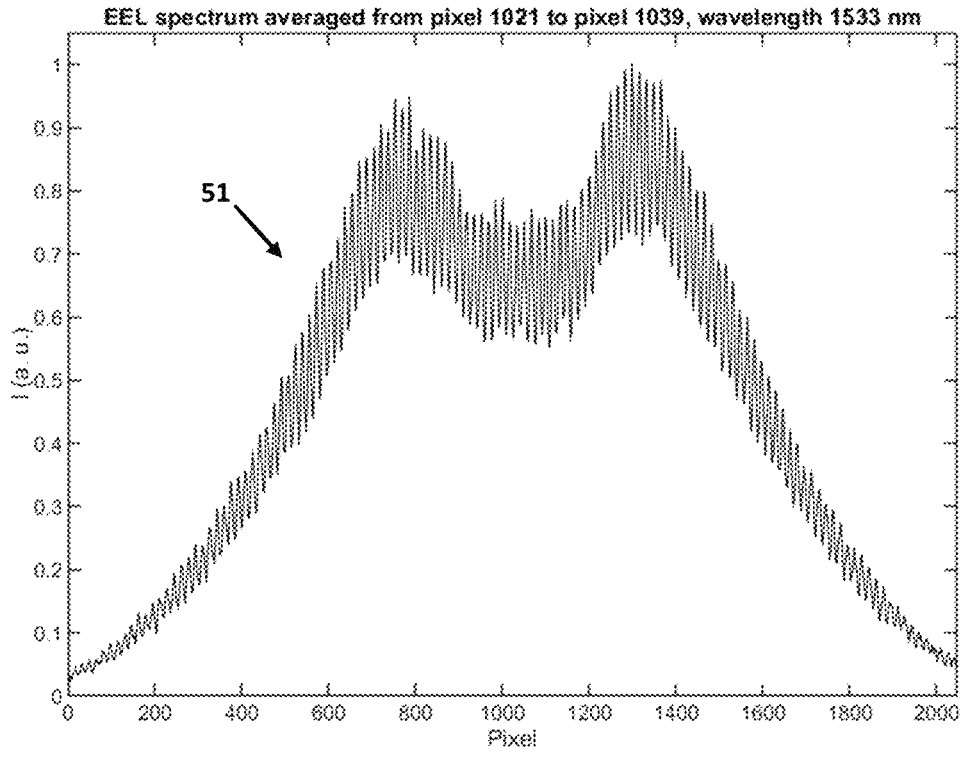

FIG. 7 shows a further electron energy loss (EEL) spectrum taken from the 2D map shown in FIG. 6, where the EEL spectrum is obtained by averaging the spectra from pixel 1021 to pixel 1039 along the vertical axis in of the 2D map in FIG. 6 (approximately in the dashed box shown in FIG. 6 merely as a visual aide).

Figure 8:
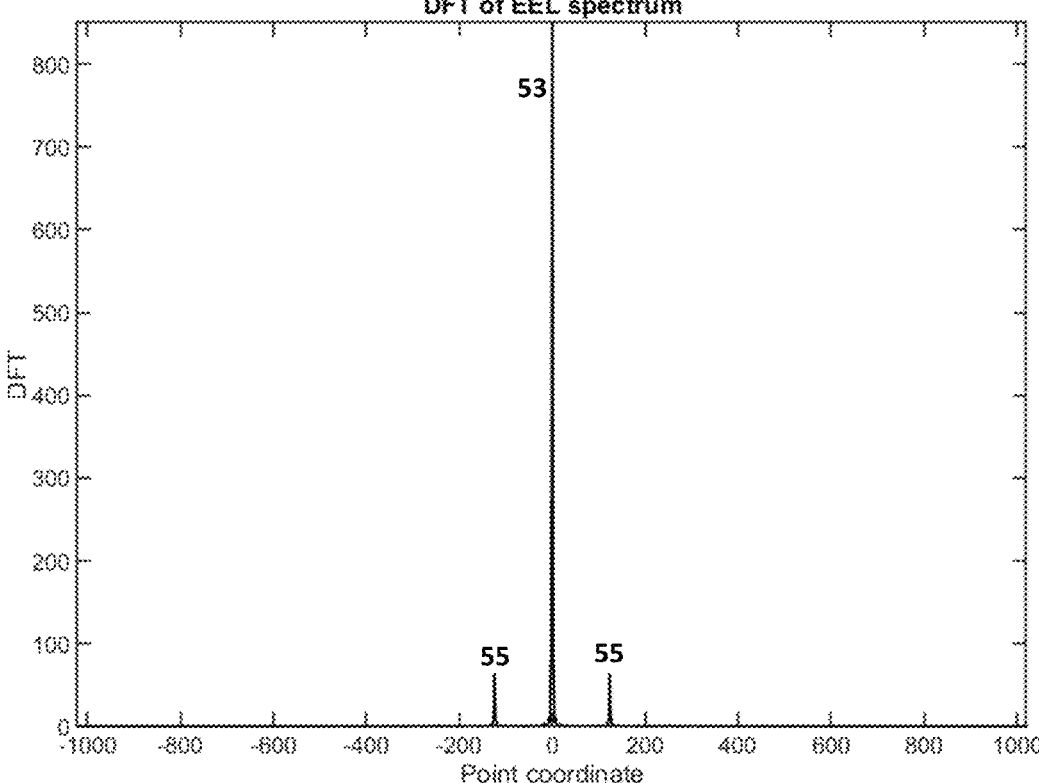

FIG. 8 shows a windowed Fourier Transform (FT) of the EEL spectrum of FIG. 7.

FIG. 9 shows a Gaussian function fit of the side peak centered at $1/E_p$ ($E_p$ being the photon energy pumping the optical resonator) obtained using a nonlinear least square method. M is the mean of the Gaussian expressed in a number of discrete data points along the reciprocal energy axis of FIG. 9.

FIG. 10 shows exemplary non-limiting method steps of the calibration method of the present disclosure.

Herein, identical reference numerals are used, where possible, to designate identical elements that are common to the Figures.

DETAILED DESCRIPTION OF SEVERAL EMBODIMENTS

FIG. 1A schematically shows an exemplary calibration system 1 for calibrating energy dispersion of an electron spectrometer 3. The electron spectrometer 3 is part of or included in an electron spectrometer system 5 (or an electron imaging/spectroscopy system 5).

The electron spectrometer system 5 may, for example, include or consist of an electron microscope, such as a transmission electron microscope 5 as shown in the non-limiting exemplary embodiment of FIG. 1A.

FIG. 1A schematically shows an exemplary system 1 or transmission electron microscope system 1 for calibrating energy dispersion of an electron spectrometer 3 of a transmission electron microscope 5 according to an exemplary embodiment of the present disclosure.

While an exemplary embodiment of the present disclosure is described herein in relation to a transmission electron microscope, the present disclosure is not limited to a transmission electron microscope. The calibration method of the present disclosure concerns and can be applied to any system 5 configured for electron imaging or electron spectroscopy or any electron spectrometer system 5 that includes at least one electron spectrometer, at least one electron source for providing an electron beam and electron optics configured and/or arranged to direct or focus the electron beam towards a target area and towards the electron spectrometer. The electron spectrometer system 5 may include a stage or adapter configured to hold an optical device holder, as is further detailed below.

The target area, is for example, a location where a sample or specimen under investigation is located and the electrons are subsequently detected by the electron spectrometer after, for example, having interacted with the sample or specimen under investigation. The electron optics and/or electron manipulation components may include, for example, electromagnetic lenses. The system may also include electron manipulation components such as one or more electrostatic plates configured to accelerate the electrons provided by the electron source towards the electron optics.

The electron spectrometer system 5 is, for example, for or configured for carrying out electron energy-loss spectroscopy (EELS).

The calibration method and system is described herein in relation to an exemplary embodiment in which the electron spectrometer system 5 comprises or consist of a transmission electron microscope 5.

The system 1 includes a transmission electron microscope (TEM) 5, an electron spectrometer 3 and a calibration device or system 7, including an optical device holder 9.

The transmission electron microscope 5 includes an electron emitter 11 configured to emit electrons in a continuous wave or beam 12. The electron emitter 11 comprises, for example, an electron gun such as a $LaB_6$ thermionic gun, or Field Emission Gun (FEG), or Spin-polarized electron source, or Negative Electron Affinity source emitting electrons in continuous wave CW mode.

The previously mentioned electron spectrometer system 5 may also include the electron emitter 11.

The transmission electron microscope 5 further includes an electron focusing mechanism 15. The electron focusing mechanism 15, for example, comprises an electron magnetic lens system configured to focus the electron beam 12 close to or in proximity to an optical resonator 17 held on the optical device holder 9. Other electron magnetic lens systems, non-illustrated in FIG. 1 for reasons of clarity, may be included for manipulation of the electron beam 12. The electron emitter 11 and the electron focusing mechanism 15 are located inside an inner chamber IC of transmission electron microscope 5 that is held under vacuum during the TEM operation.

The electron spectrometer system 5 may also include the electron focusing mechanism 15 and, optionally, the other electron magnetic lens systems.

The electron spectrometer system 5 is configured to receive the optical device holder 9 to permit interaction between the electron beam 12 and an optical device 25 and the optical resonator 17 held by or on the optical device holder 9.

In the exemplary embodiment of FIG. 1A, the transmission electron microscope 5 also includes a column 19, inside which the electron emitter 11 and the electron focusing mechanism 15 are located, and a port 21 located at the side of the column 19. The port 21 includes an aperture 23 configured to receive the optical device holder 9 and through which the optical device holder 9 passes to be located inside the column 19 to permit interaction between the electron beam 12 and an optical device 25 and the optical resonator 17 held by or on the optical device holder 9. The optical device 25 may, for example, comprise or consist of a photonic chip. The optical device 25 includes the optical resonator 17 and a coupling or bus waveguide 27 located beside or in proximity to the optical resonator 17 to assure light coupling between the optical resonator 17 and the coupling or bus waveguide 27 via evanescent light field coupling. A portion P1 (see, for example, FIG. 1C) of the coupling or bus waveguide 27 extends side-by-side the optical resonator 17 and in spatial proximity thereto to assure evanescent light field coupling.

A first extremity E1 of the bus waveguide 27 is optically coupled to an extremity E1F of a first optical fiber or waveguide OF1. A second extremity E2 of the bus waveguide 27 is optically coupled to an extremity E2F of a first optical fiber or waveguide OF2. The first and/or second extremities E1, E2 of the bus waveguide 27 may be tapered to permit higher light coupling with the first and second optical fibers OF1, OF2. The extremities E1F, E2F of the first and second optical fibers OF1, OF2 may, for example, be attached to the optical device 25 by an adhesive or epoxy (for example, a UV curable epoxy) and attached to be respectively in proximity to the first and second extremities E1, E2 of the bus waveguide 27 to assure light coupling therebetween.

The optical device 25 is, for example, tapered at an extremity where the optical resonator 17 is located. The optical device 25 includes a first and second sidewall SW1, SW2 that extend to converge towards each other to define a tapered structure surrounding the optical resonator 17. The tapered or triangular-shaped extremity or edge minimizes undesired electron-substrate interactions.

The first and second optical fibers OF1, OF2 extend to exit the system or TEM 5 or the inner chamber IC thereof. The port 21 or system/transmission electron microscope 5 includes, for example, a first and a second vacuum fiber feedthrough or vacuum-sealed feedthrough FT1, FT2 (see, for example, FIG. 1F) configured to seal off or isolate the inner chamber IC and/or the vacuum of the system/transmission electron microscope 5 from the external/outer environment surrounding the TEM 5, and configured to allow the first and second optical fibers OF1, OF2 to pass through a flange or wall closure WC of the port 21 or system/TEM 5 to the external environment surrounding the system/TEM 5, as disclosed in Reference 9. The vacuum fiber feedthroughs may, for example, comprise or consist of Teflon.

This permits light to be transmitted into and out of the system/TEM 5. A portion of each of the first and second optical fibers OF1 and OF2 is located inside the system/TEM 5 in the controlled vacuum environment of the TEM 5, and a further portion is located outside the system/TEM 5 in the surrounding environment of the system/TEM 5. An optical signal or light can, for example, be provided to the optical device 25 inside the system/TEM 5 via the first optical fiber and an optical signal or light can, for example, be transported back from the optical device 25 inside the system/TEM 5 via the second optical fiber OF2.

The system/TEM 5 may further include a stage or adapter configured to hold the optical device holder 9 and position the optical device 25 in a position permitting interaction with the electron beam 12. The optical device 25 is positioned by the stage or adapter, for example, in a sample region of the system/TEM 5.

The stage or adapter is, for example, configured to displace the optical device holder 9 in 3 dimensions, for example, in a X-plane and a Y-plane and in height or Z-direction. The stage may further be configured to tilt the optical device holder 9 in at least one tilt direction. This facilities alignment between optical resonator 9 and the electron beam 12.

The optical device holder 9 comprises, for example, an elongated body and is configured to hold the optical device 25 at an extremity of the elongated body. The elongated body includes a base, for example, a T-shaped base to which the optical device 25 is attached and held. The optical device 25 is, for example, attached to the optical device holder 9 at an extremity thereof by an adhesive or epoxy or mechanical fixture. The optical device 25 is positioned on the optical device holder 9 to place the optical resonator 17 at an outer extremity of the optical device holder 9 that is closest to the electron beam 12 trajectory when the optical device holder 9 is positioned in the port 21 or system/TEM 5. The optical device holder 9 may further include a hollow tube or chamber inside and through which the first and second optical fibers OF1 and OF2 extend.

Another particular aspect of the present disclosure concerns the calibration device or system 7. The calibration device or system 7 includes the optical device holder 9 and also includes the first and second optical fibers OF1, OF2 as described previously. The calibration device or system 7 may further include a light source or tunable light source 31 for providing light to be coupled into the optical resonator 17 for pumping or exciting one or more resonant optical modes of the optical resonator 17. The light source may be CW light sources such as a laser light source, for example, a fiber laser, a laser diode, or a semiconductor laser.

Light provided by the light source 31 is injected into the bus waveguide 27 via the first optical fiber OF1. Light travels through the bus waveguide 27 and is partially transferred to the optical resonator 17, partially reflected, and partially transmitted through the bus waveguide 27 and to the second optical fiber OF2. When the wavelength of the light traveling in the bus waveguide 27 matches a resonance wavelength of the optical resonator 17, a portion of the provided optical power in the bus waveguide 27 is transferred into the resonant mode in the cavity of the optical resonator 17.

The calibration device or system 7 may further include optical wavelength determination means 33 for determining a wavelength of the light provided or coupled into the optical resonator 17, or an optical wavelength determiner 33 configured to determine a wavelength of the light provided or coupled into the optical resonator 17. The light provided by the light source can, for example, be provided to the optical wavelength determination means 33, which may, for example, comprise an optical spectrometer, optical spectrum analyzer, or wavelength meter for determining the wavelength of the light provided or coupled into the optical resonator. The optical wavelength determination means 33 preferably allows precisely calibrating the wavelength of the light generated by the light, for example, with accuracy or resolution between 10 and 1000 picometers (pm), for example, of 10 pm. An optical light splitter SP, for example a fiber splitter or a free-space splitter, is included to siphon or deviate a portion of the light emitted by the light source to the optical wavelength determination means 33 and providing the remaining portion to the optical resonator 17 via the optical fiber OF1. The optical wavelength determination means 33 is configured to determine the wavelength of the light provided to the optical resonator 17 and store and/or display the determined wavelength.

The calibration device or system 7 may include a polarization controller (MPC) permitting to set the light polarization of the light provided to the optical resonator 17 via the first optical fiber OF1 to improve light coupling with the resonant modes of the cavity of the optical resonator. The polarization controller may alternatively be located downstream of the optical wavelength determination means 33. The polarization controller may, for example, comprise a fiber polarization controller.

The calibration device or system 7 may also further include resonance wavelength determination means 35 configured for determining wavelength matching of light coupled to the optical resonator 17 at a resonance wavelength of optical resonator 17, or a resonance wavelength determiner 35 configured to determine wavelength matching of light coupled to the optical resonator 17 at a resonance wavelength of optical resonator 17. The resonance wavelength determination means 35 may include an optical light intensity detector 37, for example, a photodiode for measuring the optical power transmitted by the bus waveguide 27 that is coupled out of the optical resonator 17, and provided to the second optical fiber OF2 to the optical light intensity detector 37.

By scanning the central frequency/wavelength of the light source 31 close to or around a resonance wavelength of the optical resonator, a dip in the optical power measured by the optical detector 37 is measured (or a signature (such as a turning point or stationary point signature) in the signal measured by the optical detector 37 representing a reduction in the optical power arriving at the optical detector 37 is measured) and indicates that the light source wavelength is resonant with a cavity resonance of the optical resonator 17.

The resonance wavelength determination means 35 may, for example, further include an oscilloscope 39, such as a digital oscilloscope, configured to monitor the optical power transmitted through the bus waveguide 27 to the optical detector 37 and allowing to tune the output wavelength of the optical source 31 to resonantly tune it to a resonance of the optical resonator 17. If the set wavelength of the CW pumping light of the optical source 31 matches a resonance wavelength of the cavity of the optical resonator 17, the dip or signature in transmitted power is observed or determined by the oscilloscope 39.

Additionally, stabilizing or maintaining the resonance condition at which the wavelength of light coupled to the optical resonator 17 matches a resonance wavelength of optical resonator 17 can be carried out by adjusting the wavelength generated by the light source 31 to maintain or obtain again the decrease in the light intensity signal (or a signature (such as a turning point or stationary point signature) representing a reduction in the optical power) representing the resonance condition.

The calibration device or system 7 may also further include at least one controller 41. The controller 41 is, for example, configured to communicate with the optical light source 31 to tune or scan an emission wavelength/frequency of the light emitted by the optical source 31. The controller 41 is, for example, also configured to communicate (directly) with the optical detector 37 to receive and process a signal measured by the optical detector 37 during tuning or scanning of the emission wavelength/frequency of the light emitted by the optical source 31.

Alternatively or additionally, the controller 41 can be, for example, configured to communicate (directly) with the oscilloscope 39 to receive and process a signal measured/generated by the oscilloscope 39 during tuning or scanning of the emission wavelength/frequency of the light emitted by the optical source 31.

The controller 41 is, for example, also configured to determine the presence of the signal dip in the optical power or signature in the optical power and to set/maintain the pumping or output wavelength of the optical source 31 at that resonance wavelength. The controller 41 is, for example, also configured to generate and/or display a signal indicating that the set wavelength of the CW pumping light of the optical source 31 matches a resonance wavelength of the cavity of the optical resonator 17. This permits to communicate that the conditions for energy coupling between the optical resonator 17 with the electron beam 12 for a calibration measurement are optimum or favorable.

The controller 41 may, for example, be configured to communicate with the optical wavelength determination means 33 and to receive or obtain the wavelength (or data representing the wavelength) of the light provided or coupled into the optical resonator 17 that is determined by the optical wavelength determination means 33. The controller 41 may, for example, also be configured to communicate this information with one or more devices external to the calibration device or system 7.

The optical source 31, the optical wavelength determination means 33, optical detector 37 and/or the oscilloscope 39 may include a local controller and/or a communication interface configure to operate with the controller 41.

The controller 41 may, for example, also include calculation or computing means or a processor CAL configured to control, command and/or communicate with the other elements of to the calibration device or system 7 to permit operation of the elements of the calibration device or system 7.

The controller 41 may also include a memory STOR (for example, semiconductor memory, HDD, or flash memory) configured to store or storing at least one program or executable instructions. The at least one program or executable instructions may comprise instructions permitting, for example, to control, command and/or communicate with the other elements of to the calibration device or system 7 to permit operation of the elements of the calibration device or system 7.

The calculation means or a processor CAL and the memory STOR can be, for example, included in a computer, portable laptop or a portable device such as a smart phone. The program or processor executable instructions can be provided, for example, as custom Matlab functions or custom communication protocols.

The processor executable instructions are provided to or obtained by the calculation means or processer CAL for execution.

The calibration device or system 7, controller 41 or the memory STOR, for example, includes a computer program including program instructions, which when executed by the processor or computer CAL cause the at least one controller 41 to adjust a wavelength generated by the light source 31, to monitor or process data or a signal representative of a light intensity signal provided to the optical resonator 17, and identify or determine a decrease in the light intensity signal (or a signature (such as a turning point or stationary point signature) representing a reduction in the optical power) representing a resonance condition at which a wavelength of light coupled to the optical resonator 17 matches a resonance wavelength of optical resonator 17.

Additionally, program instructions may be included to cause the at least one controller 41 to stabilize or maintain the resonance condition at which the wavelength of light coupled to the optical resonator 17 matches a resonance wavelength of optical resonator 17 by adjusting the wavelength generated by the light source 31 to maintain or obtain again the decrease in the light intensity signal (or a signature (such as a turning point or stationary point signature) representing a reduction in the optical power) representing the resonance condition.

The computer program may also include program instructions, which when executed by the processor or computer CAL cause the at least one controller 41 to generate and/or display a signal indicating that the set wavelength of the pumping light of the optical source 31 matches a resonance wavelength of the cavity of the optical resonator 17.

As mentioned, the optical device 25 includes the optical resonator 17 and the coupling or bus waveguide 27.

The optical resonator 17 has, for example, a high Q factor (for example, $Q_0 \geq 0.1 \times 10^6$), that is, the optical resonator 17 is preferably a high-Q resonator. The high-Q factor cavity enhancement and a waveguide designed for phase matching assure efficient electron-light interaction.

The optical resonator 17 is configured to assure coherent phase modulation of the continuous electron beam 12 when the optical resonator 17 is excited or driven by the continuous-wave light source 31.

The optical resonator 17 is configured to assure an electron-light interaction that generates discrete electron energy sidebands at integral multiples of the photon energy.

Phase modulation of the free-electron beam 12 occurs by the cavity photons of the optical resonator 17, inducing transitions between the free-electron energy states.

A phase-matched interaction of the electrons of the electron beam 12 with light circulating in the optical resonator 17 generates an electron spectrum or electron energy loss spectrum such as that shown in FIG. 2A and in the electron energy spectral map of FIG. 1B. The phase modulation results from the phase-matched interaction of the electrons with the evanescent near-fields and the strong electron-photon coupling.

A phase-matched interaction of electrons with light circulating in the optical resonator 17 in a TEM 5 provides an inelastic interaction with the electrons and leads to the exchange of an integer number of photons. The resulting equally-spaced peaks generated in the spectrum of the interacting electrons can be used as a very precise ruler for calibrating the energy axis of the electron spectrometer, as discussed further below. This calibration method is readily applicable to any modern electron microscope.

The coupling strength is directly proportional to the optical field strength and the phase-matched interaction length. The optical resonator 17 can be configured to assure a very large coupling strength due to a high Q factor and the extended phase-matched interaction.

When the optical resonator comprises a ring resonator, an increase in ring resonator radius can further sharpen the phase-matching condition in energy.

The optical resonator 17 can be, for example, configured to match the phase velocity of the excited optical mode of the optical resonator 17 with the group velocity of electrons of the electron beam 12.

The electron spectrometer system 5 can, for example, be set or aligned at a specific electron energy for exchanging energy between electrons and light propagating in the optical resonator 17. The electron velocity can, for example, be matched with the phase velocity of the light resonating the optical resonator 17. An alignment of the electron spectrometer system 5 can be carried out to concentrate the electron beam 12 in the vicinity of the optical resonator 17 in which an optical power contained therein is sufficiently high to create an electron energy loss spectrum containing a plurality of sideband peaks. The plurality of sideband peaks created populates, for example, the entire range of the spectrometer energy scale to assure higher precision of dispersion calibration and determination of the spectrometer non-linearities; Electrons emitted by the electron gun 11 in a continuous wave (CW) mode and accelerated in the system/TEM 5 are, for example, phase-matched with the resonator cavity modes, and the electron beam interacts with the co-propagating evanescent field of the resonator in, for example, the object plane of the TEM.

The optical resonator 17 comprises an optical waveguide 43 extending to define an optical cavity. The optical waveguide 43 may extend, for example, to define a structure supporting whispering gallery confined optical modes or resonances. The optical waveguide 43 may extend, for example, to define a ring resonator/microresonator, as shown for example in FIGS. 1C to 1E.

The optical waveguide 43 is embedded in a cladding layer or structure 45. The optical waveguide 43 comprises a material (for example, $Si_3N_4$) of a higher refractive index than the material (for example, $SiO_2$) of the cladding layer or structure 45.

The coupling or bus waveguide 27 is also embedded in the cladding layer or structure 45 and comprises, for example, the same material as the optical waveguide 43. The coupling or bus waveguide 27 extends between the optical waveguide 43 and attachment zones on the optical device 25 where the extremities E1, E2 of the bus waveguide 27 is optically coupled to the optical fibers OF1, OF2 as previously described. A portion P1 of the bus waveguide 27 extends in proximity to the optical resonator 17 to assure evanescent light field coupling between the bus waveguide 27 and the optical waveguide 43.

The optical waveguide 43 and the bus waveguide 27 may, for example, define a rectangular cross-sectional profile, as for example shown in FIG. 1D. The optical waveguide 43 and the bus waveguide 27 extend in a planar manner on the optical device 25. The optical waveguide 43, for example, includes an uncovered outer surface to assure better coupling with the electron beam 12.

The optical device 25 may be fabricated using the photonic Damascene process as described in references [9] to [11], and in U.S. Pat. No. 10,191,215, the entire contents of each of which are incorporated herein by reference.

The optical device 25 may, for example, be a $Si_3N_4$-based photonic chip. The photonic chip is made of $Si_3N_4$ waveguides in a $SiO_2$ substrate or layer. The microresonator 17 has a ring shape with a radius of, for example, 20 μm and a cross section of, for example, 2 μm×650 nm. Around the microresonator ring 17, the $SiO_2$ substrate can be reduced in thickness to reduce the substrate's charging effects, which may cause a distortion of the electron beam.

The design of the cavity geometry can be made with an effective refractive index to provide a phase-matching condition between the optical mode and electrons, which implies a field phase velocity equal to the electron group velocity, for example, for electrons at 120 keV. The optical cavity has a high-Q factor that assures very narrow linewidths of the resonant modes. The bus waveguide 27 may, for example, have a cross-sectional profile of 800 nm×650 nm. Phase matching at a defined electron energy is achieved by modifying the geometry/dimensions of the optical waveguide 43.

Further exemplary details of the optical device 25 can be found in reference [9].

The electron spectrometer 3 of the system/TEM 5 is configured to measure an electron energy loss (EEL) spectrum (see, for example, FIGS. 1B, 2A) of the electrons that have interacted with the optical resonator's confined optical modes. The electron spectrometer 3 may, for example, be a post-column electron spectrometer, as shown for example, in FIG. 1A, or in-column.

The electron spectrometer 3 comprises, for example, at least one electron spectrometer detector 47 and an electron energy dispersing means 49 configured to disperse the electrons in accordance with their energy or an electron energy disperser 49 configured to disperse the electrons in accordance with their energy. The electron energy dispersing means 49 may comprise, for example, an energy dispersing magnetic prism. The electron spectrometer detector 47 may comprise a photodiode array, a CMOS device, a CCD device/camera, a direct electron detector, or a pixelated electron detector The electron energy dispersing means 49 is arranged to disperse the electrons in accordance with their energy onto the electron spectrometer detector 47, for example, via a scintillator that converts the electron energy to optical energy for detection by the detector 47.

The electron spectrometer 3 may, for example, comprise or consist of a Gatan Imaging Filter (GIF) including a CCD camera. The electron energy loss (EEL) spectrums shown in FIGS. 1B and 2A were taken using an electron spectrometer 3, including a Gatan Imaging Filter (GIF) and a CCD camera of 2048×2048 pixels.

An aspect of the present disclosure concerns a calibration method permitting to calibrate energy dispersion of the electron spectrometer 3 and more precisely determining the (average) energy dispersion ΔE of the electron energy-loss spectrometer 3, as will now be disclosed in more detail.

The calibration method is described with reference to an exemplary and non-limiting configuration or embodiment of the system 1 of FIG. 1A arranged for the purposes of demonstrating the calibration method of the present disclosure, as will now be described.

In this exemplary and non-limiting configuration or embodiment of the system 1, the photonic chip 25 is made of $Si_3N_4$ waveguides in a $SiO_2$ substrate. The microresonator 17 has a ring shape with a radius of 20 μm and a cross section of 2 μm×650 nm. Around the microresonator ring, the $SiO_2$ substrate has been reduced to reduce the substrate's charging effects. The design of the cavity geometry was made with an effective refractive index to provide a phase-matching condition between the optical mode of the resonator 17 and the electrons, which implies a field phase velocity equal to the electron group velocity, for electrons at 120 keV. The cavity high-Q factor provides a very narrow linewidth of the resonant modes.

A TEM JEOL JEM-2100 HR was, for example, used with a $LaB_6$ thermionic gun. Electrons were emitted by the gun in a continuous wave (CW) mode and accelerated to 120 keV, allowing for phase-matching with the cavity modes of the ring-resonator 17. The Ultrafast TEM has a modified column with an additional condenser allowing different operating modes than the standard JEOL 2100 electron optics. The additional condenser lens can provide a "pseudo" 3-condenser lens mode, allowing for nanoprobe beams in low magnification mode with electron beam currents of ~1 nA. The nanoprobe electron beam was tightly focused close to the sample surface S1, having a spot size of ~100 nm with a convergence angle <1 mrad. The electron spectrometer 3 includes a Gatan imaging filter (GIF) used with a 2048× 2048 pixel US1000 CCD camera for measuring the electron spectrum. A diode laser 31 was used to generate laser light in CW mode.

The laser light was sent through an optical fiber to for example, a laser controller equipped or combined with an optical spectrometer 33, which allows setting the output wavelength with a precision of, for example, 10 pm. The light may be sent to an erbium-doped fiber amplifier with an output power of, for example, ~200 mW. After that, the light in the fiber passed through a manual fiber polarization controller with which one can set the light polarization to obtain the highest coupling with the resonant modes of the cavity of the ring resonator 17. A small fraction of the light power (for example, typically 1%) can optionally be redirected to a wavelength meter for monitoring the laser light wavelength with a higher precision. The input fiber OP1 carrying this polarized light entered the microscope 5 through the holder 9. A custom-built flange WC (FIG. 1F) was used to minimize the losses in fibers due to fiber connectors, allowing the fibers to enter the holder 9 directly through the Teflon-sealed feedthrough FT1, FT2. This input fiber OF1 was coupled to the photonic chip 25 mounted on the tip of the holder 9 with the surface S1 of the photonic chip 25 being orientated parallel to the axis of the microscope column 5 to have the electron beam 12 passing parallel to the surface S1, maximizing the interaction time.

The laser light is injected into the photonic chip 25 with $Si_3N_4$ waveguides in a $SiO_2$ substrate. The light propagating in the bus waveguide 27 (which is provided thereto by the fiber OF1) was partially transferred to the microresonator 17, partially reflected, and partially transmitted through the bus waveguide 27. When the frequency or wavelength of the light injected in the bus waveguide 27 matches one of the resonant modes of the cavity of the resonator 17, a fraction of the optical power is transferred and stored in the microresonator 17.

After the microresonator 17, the bus waveguide 27 is coupled to the output optical fiber OF2 that exits the microscope 5 through the same flange WC as the input optical fiber OF1. This fiber OF2 was connected to the photodetector 37 (DET01CFC/M, ThorLabs) used for measuring the transmitted power. The transmitted signal was monitored with a digital oscilloscope 39 (RIGOL DS4054).

The high-Q factor (about $10^6$) of the microresonator (17) gives narrow resonance peaks, with total linewidths of a few hundred MHz. A wave generator (DS345, Stanford Research Systems) was used to find the cavity resonances, providing a 50 Hz sawtooth wave signal to the input of the CW laser controller. This signal was used to perform a time scan over an interval of wavelengths, namely to transform the horizontal axis of the oscilloscope into a frequency axis. By manually scanning the central frequency of the laser, close to resonance, a dip in the transmitted power appeared, which is an indication of a cavity resonance. After identifying the resonance wavelength, the electron beam is focused at the specimen surface S1. Scanning the beam along or across the surface S1 of the resonator 17, it is possible to find a beam position corresponding to the maximum broadening of the electronic spectrum, which corresponds to the center of the microresonator ring.

The transmission electron microscope or electron spectrometer energy dispersion calibration method of the present disclosure includes the step of finding at least one resonance wavelength of the optical resonator 17. This can be done by adjusting or scanning the (central) wavelength of the light generated by the optical source 31. The power transmitted by the bus waveguide 27 back to the output fiber OF2 is monitored and the resonance condition is identified by a decrease in the transmitted power. Scanning the central frequency/wavelength of the light source 31 close to or around a resonance wavelength of the optical resonator 17 is carried out to determine a dip in the optical power measured by the optical detector 37 or a signature (such as a turning point or stationary point signature) in the signal measured by the optical detector 37 representing a reduction in the optical power arriving at the optical detector 37 is measured). This indicates that the light source wavelength is resonant with a cavity resonance of the optical resonator 17.

The electron beam 12 is then positioned relative to the surface S1 of the optical resonator 17 to permit interaction of the electrons with light circulating in the optical resonator 17 and to obtain an electron energy loss spectrum produced by electrons exchanging energy with the resonant optical mode of an optical resonator 17 into which light at the resonant wavelength is coupled.

According to one exemplary embodiment, the electron energy loss spectrum acquisition can be carried out using the exemplary system of FIG. 1A. The ring-based microresonator 17 is mounted on the optical device holder 9 with a vacuum-sealed feedthrough for the pair of optical fibers OF1, OF2. The fibers OF1, OF2 are connected to the bus waveguide's 27 input E1 and output E2 that is used to pump the microresonator 17.

The input fiber OF1 is connected to, for example, a near-infrared CW fiber laser 31, allowing for tuning the light wavelength to match one of the resonances of the micro-ring cavity of the optical resonator 17. The output fiber OF2 is connected to the photodetector 37 used to measure the transmitted power passing through the optical chip 25.

The resonator ring 17 is oriented vertically in the TEM 5. The resonator ring 17 extends in a plane and the plane defined by the resonator ring 17 or the optical device 25 is oriented to be parallel to the direction of extension of the column 19 of the TEM 5. The resonator ring 17 is oriented in the TEM 5 so that the electron beam 12 and the electrons propagate (substantially) parallel to this plane or to the extension direction of the outer surface S1 of the optical resonator 17, or along the outer surface S1, such that the interaction time with the optical cavity field is increased or maximized.

The electron beam 12 is thus passed or scanned over or across the surface S1 or plane defined by the optical resonator 17 or the optical device 25 (for example, without contacting the optical device 25) and towards or in the direction of the electron spectrometer 3. The electron beam 12 is passed or skimmed over the optical resonator 17 at a location over the optical resonator 17 that permits an interaction time with the optical cavity field and/or assures an electron-light interaction that generates discrete electron energy sidebands at integral multiples of the photon energy.

The (post-column) electron spectrometer 3 collects the electrons after having interacted with the optical cavity of the optical resonator 17 and measures their energy spectrum or electron energy loss spectrum.

FIG. 1B shows the spatially resolved electron energy map of a transversely elongated electron beam 12, which is located at the center of the micro-ring resonator 17, as shown in the inset in FIG. 1A, where the coupling constant of the electron-photon coupling of the electrons with the evanescent near-fields of the optical cavity of the resonator 19 has or is close to maximum.

For the measurements shown in FIG. 1B, the wavelength of the CW pumping laser 31 was set to 1549.0 nm. The cavity mode wavelength is 1549.0 nm. The vertical scale corresponds to a distance in the direction normal to the optical resonator surface S1. The horizontal axis corresponds to the electron energy change. The top horizontal scale is represented in eV relative to the zero-loss peak (ZLP) located at the 1025th channel using a nominal dispersion of 100 meV/channel. As mentioned previously, the electron spectrometer 3 used for the measurements comprises a Gatan Imaging Filter (GIF) and a CCD camera of 2048×2048 pixels.

The electron spectra, as seen in FIG. 1B, are symmetric to the initial electron energy (zero on the top scale of FIG. 1B) as predicted by photon-induced near-field electron microscopy (PINEM) theory. The plot in FIG. 1B exhibits prominent vertical lines, with the spacing approximately equal to the photon energy (about 0.8 eV in the present exemplary case). The width of the electron spectrum becomes smaller at larger distances (positive values of the vertical axis) because the near field decays exponentially as one moves further away from the cavity surface S1 of the optical resonator 17.

The method for calibrating the electron spectrometer 3 according to the present disclosure relies on the fact that the distance between two consecutive subbands (peaks) in the electron spectrum is set by the photon energy. This array of peaks provides a reference for determining the spectrometer calibration over a large area of the sensor or detector 47.

The cross-section of the electron energy loss spectrum EELS map of FIG. 1B at a distance of 120 nm (approximately along the dashed line in FIG. 1B) from the optical resonator surface S1 is presented in FIG. 2A. The zoomed-in central part of the spectrum (FIG. 2B) shows the array of equidistant sidebands.

A Fourier transform FT, for example, performed of the whole electron energy loss spectrum 51 (or a selected part 57 of the electron energy loss spectrum 51 that is a subset of the whole electron energy loss spectrum 51) to identify or determine the (average) energy dispersion calibration (ΔE) measured in [eV/channel] for the chosen spectrometer settings (data points in FIG. 2C).

The FT has a prominent peak 53 centered at zero corresponding to the DC spectral component and a smaller peak or sideband peak 55 at a finite frequency originating from the photonic sidebands that is shown in FIG. 2C. The center of this peak 55 in the FT corresponds to the sampling rate of the electron spectrometer 3 as:

$$\Delta E = f_E \frac{hc}{\lambda N}, \tag{1}$$

where $f_E$ is the center of the FT peak 55, $\lambda$ is the wavelength of the optical field, h is the Planck's constant, c is the speed of light in a vacuum, and N is the number of channels of the spectrum used to compute the FT.

If using the whole spectrum, N is equal to 2048 in the present exemplary case. The center of the FT peak 55 can be found by fitting it with a peak fitting function, for example, a Gaussian function in the present example (solid line in FIG. 2C).

A center of the sideband peak 55 can be determined by fitting the sideband peak 55 with a peak fitting functions such as a Gaussian function or alternatively using other peak fitting functions such for example, Lorentzian or for example pseudo-Voight. The center of the side peak 55 is, for example, determined to be the center of the peak of the fitted peak fitting function.

Substituting the values into Equation (1) gives an average dispersion of ΔE=97.339 meV/channel. The obtained dispersion is close to the announced nominal value of 100 meV/channel set for the electron spectrometer 3. However, an error of ≈2.7 meV in the energy dispersion value can lead to significant errors in the measurements, e. g. the chemicals shifts of <500 meV would be challenging to quantify having this error in the dispersion calibration.

The calibration method of the present disclosure is illustrated by a further example described below in association with FIGS. 6 to 9.

When the optical resonator 17 is being pumped or excited at a resonance wavelength, an electron energy loss spectrum 2D map, as shown in FIG. 6, is acquired using the electron spectrometer 3. This is shown in FIG. 6 for the case of a resonant mode of the optical resonator 17 of this example having a resonant wavelength of 1531.7 nm.

Like FIG. 1B, the horizontal axis of FIG. 6 represents the energy-loss/gain axis. The numbers on this axis are the coordinates of the channels of the camera 47 (from 1 to 2048 in this exemplary case). For mapping the channel numbers to the actual energy loss, one needs the energy dispersion in eV/channel. The vertical axis is the spatial coordinate along the axis perpendicular to the sample surface S1, in units of CCD camera pixels. The sample surface is located at around pixel (or pixel row) 1020, with the electrons passing above the surface at larger pixel coordinate values. Electron intensity (counts) is encoded in the grayscale.

A single EEL spectrum can be selected by choosing a single pixel (or pixel row) of the vertical axis of the EELS 2D map (FIG. 6). Alternatively, it is possible to select an interval or group of pixels or pixel rows along the vertical axis and determine an average EEL spectrum that is subsequently used to calibrate the electron spectrometer 3.

In the present example, an EEL spectrum is obtained by averaging the single spectrum between pixel (or pixel row) 1021 and 1039 (indicated approximately by the dashed box in FIG. 6). This group of the spectrum was selected because it gives the minimum uncertainty over the energy dispersion.

The EEL spectrum used in the calibration method can thus be an energy spectrum determined based on a calculated average of a plurality of EEL spectrum measured or obtained at different distances from the outer surface S1 of the optical resonator 17.

This average spectrum, obtained by averaging the single spectrum between pixel (or pixel row) 1021 and 1039, is shown in FIG. 7. The vertical axis, like in FIG. 2A, is or represents the electron intensity (in arbitrary units), while the horizontal axis is the CCD camera pixel (same horizontal axis of FIG. 6). The EEL spectrum 51 includes or consists of many sidebands (peaks) around or either side of the zero-loss peak (ZLP), equally spaced by the photon energy.

Each sideband represents a photon absorbed (energy gain) or emitted (energy loss) by the electron from or to the optical mode of the excited or optically pumped optical resonator 17.

Since the photon energy can be measured or determined with high accuracy, thanks to the optical wavelength determination means 33 (for example, the optical spectrometer 33), the energy dispersion of the electron spectrometer can be determined with high accuracy.

FIG. 8 shows the FT of the spectrum 53 of FIG. 7. The horizontal axis represents the reciprocal energy space. The 2048 pixels of the energy-loss axis in FIG. 7 are mapped in the 2048 equally spaced discrete points along the reciprocal energy axis.

The FT has a central peak 53 (FIG. 8) centered at zero (DC peak) and two side peaks 55 centered at $\pm 1/E_p$ (in FIG. 8 still in terms of inverse of the pixel coordinate), where $E_p$ is the photon energy.

The position of the side peak centered at $1/E_p$ is also equal to $f_E \cdot \Delta f$, where $f_E$ is the number of points between the center of the side peak 55 and the zero of the axis, and $\Delta f$ is the spacing between the points along the reciprocal energy axis. The latter is equal to $1/(N \cdot \Delta E)$, where N is the number of data points in the EEL spectrum 51 along the energy axis (equal to 2048 in the present example), and $\Delta E$ is the energy dispersion. Therefore, one notes the following relation:

$$\frac{1}{E_p} = f_E \cdot \Delta f = \frac{M}{N \cdot \Delta E}$$

from which the energy dispersion $\Delta E$, previously presented in equation (1) with respect to wavelength, can be obtained as follows with respect to photon energy:

$$\Delta E = \frac{f_E \cdot E_p}{N}$$

For estimating the error of the determined energy dispersion, the primary sources of error are the wavelength measurement and the estimation of the center of the FT peak $f_E$. Therefore, the error estimation of the determined energy dispersion is given by the equation $$\frac{\delta(\Delta E)}{\Delta E} = \sqrt{\left(\frac{\delta f_E}{f_E}\right)^2 + \left(\frac{\delta \lambda}{\lambda}\right)^2} \quad (2)$$

In other words, the precision and accuracy on the energy dispersion are related to the accuracy and precision on the peak position $f_E$ and the wavelength of the photon. The photon energy is related to the wavelength by $E_p = hc/\lambda$ where h is the Planck's constant and c is the speed of light in vacuum.

In the present example, $\Delta$ and $\delta\lambda$ are set by the optical wavelength determination means 33 that is the optical spectrometer 33 which in the present example allowed to select the wavelength with both an accuracy and precision of around 100 pm (picometer). Therefore, $\delta\lambda$ is about 100 pm and for a central wavelength of 1531.7 nm, $\delta\lambda/\lambda \approx 6.523 \cdot 10^{-5}$.

The error in the estimation of the center of the FT peak $f_E$ can be taken, for example, as half of the 95% confidence interval for the center of the fitted Gaussian function.

To obtain $f_E$ and $\delta f_E$, the side peak 55 in the FT is fitted, for example, with a Gaussian using the nonlinear least square method. $f_E$ is estimated as the center of the Gaussian peak. The error on the peak position $\delta f_E$ is estimated as half of the width of the 95% confidence interval of the mean value, which is given by $t\sqrt{\text{diag}(S)_M}$.

t depends on the confidence level and is obtained from the inverse of the t-Student cumulative distribution. S is the covariance matrix of the fitted parameters, and $\text{diag}(S)_M$ is the element of its diagonal with the same row coordinate of the mean $f_E$ in the coefficients vector.

FIG. 9 shows the Gaussian fit of the side peak. The fit gives $f_E = 123.864$ and $\delta f_E = 0.022$.

The energy dispersion $\Delta E$ and its error $\delta(\Delta E)$ are obtained or determined by using the data obtained from the fit.

In the present example, the energy dispersion is $\Delta E = 48.9149$ meV/ch. The relative error on the peak position is $\delta f_E/f_E = 1.78 \cdot 10^{-4}$. Therefore, the relative error in the energy dispersion is $\delta(\Delta E)/\Delta E = 1.8914 \cdot 10^{-4}$. Finally, the precision or accuracy of the energy dispersion can be determined and is: $\delta(\Delta E) = 0.0093$ meV/ch.

Therefore $\Delta E = 48.9149 \pm 0.0093$ meV/ch

The calibration method of the present disclosure allows determining the energy dispersion with a precision and accuracy down to the $\mu$eV/ch. It is noted that the nominal value of energy dispersion in the used spectrometer 3 was 0.05 eV/ch, wrong of about 1 meV/ch with respect to its real value determined above. Such large errors are detrimental to high-resolution EELS studies, and the calibration method of the present disclosure can now prevent avoiding such large errors and favors high-resolution EELS.

The error of the determined energy dispersion is calculated according to the above equation (2) for the calibration of the electron spectrometer 3 is found to have a $\mu$eV per channel accuracy and precision.

As follows from the above, the energy dispersion calibration method may comprise, for example, obtaining and/or providing at least one electron energy loss spectrum 51 produced by electrons exchanging energy with at least one resonant optical mode of an optical resonator 17 into which light at a resonant wavelength k is coupled, calculating and/or providing a Fourier transform (FT) of the at least one electron energy loss spectrum 51 (or a selected part 57 of the electron energy loss spectrum 51 that is a subset of the whole electron energy loss spectrum 51), and determining and/or providing an energy dispersion $\Delta E$ of the electron spectrometer 3 determined according to the equation $$\Delta E = f_E \frac{hc}{\lambda N} \text{ or } \Delta E = f_E \frac{E_p}{N}$$

where λ is the resonant wavelength of the light coupled into the optical resonator 17, h is constant, and c being is the speed of light in a vacuum, $E_p$ is the resonant photon energy of the light coupled into the optical resonator 17, N is the number of channels or data points along the energy axis of the at least one electron energy loss spectrum 51 (or a selected part 57 of the electron energy loss spectrum 51 that is a subset of the whole electron energy loss spectrum 51) used in determining the Fourier transform (FT) of the at least one electron energy loss spectrum 51, and $f_E$ is a number of reciprocal energy space data points or coordinates between (i) a DC spectral component peak 53 of the Fourier transform (FT) of the at least one electron energy loss spectrum 51 and (ii) a side peak 55 or a center of a side peak 55 of the Fourier transform (FT) of the at least one electron energy loss spectrum 51, the side peak 55 originating from electron energy exchange with the at least one resonant optical mode of the optical resonator 17.

The center of the side peak 55 is, for example, determined by fitting the side peak 55 with a Gaussian function. The center of the side peak 55 is determined to be the center of the peak of the fitted Gaussian function.

The accuracy or error value δ(ΔE) of the energy dispersion ΔE may be determined and/or provided according to the equation $$\delta(\Delta E) = \sqrt{\left(\frac{\delta f_E}{f_E}\right)^2 + \left(\frac{\delta \lambda}{\lambda}\right)^2} \cdot \Delta E$$

where δλ is an accuracy or error value of the wavelength value or wavelength measurement of the resonant wavelength of the light coupled into the optical resonator, and $\delta f_E$ is the accuracy or error value of the determined center of the side peak 55 of the Fourier transform (FT) of the electron energy loss spectrum 51.

The accuracy or error value $\delta f_E$ of the determined position of a center of the side peak 55 can, for example, be determined as half of the width of a confidence interval of the mean value of the fitted Gaussian function. The confidence interval is set to be between a 90% confidence interval and a 99% confidence interval or a 90% to 99% confidence level, or the confidence interval is preferably a 95% confidence interval or at a 95% confidence level.

Spectrometer aberrations and nonlinearities can lead to different calibration parameters or values at different parts of the sensor 47.

By repeating the same method described above but, instead of the whole electron energy loss spectrum 51, a window or a spectral subset of the spectrum 51 is used as input to compute the FT to determine the energy dispersion of the channels within the spectral window. By sliding the window along the whole spectrum, one can determine the energy dispersion in different regions of the spectrometer 3 (and for each channel), thus giving a quantitative analysis for nonlinearity characterization. This is subsequently used for calibration correction of the determined (average) energy dispersion.

For demonstrating this, the spectrometer dispersion and its error is evaluated as a function of or depending on the size of a spectral window or spectral subset 57 of the electron energy loss spectrum 51 used for determining or calculating a Fourier transform. FIG. 3A shows spectrometer dispersion obtained from the FT of the spectrum in FIG. 2A utilizing spectral windows 57 of different widths at the central part of the spectrum 51. The inset of FIG. 3A displays a spectral window 57 with an exemplary width of 1000 channels (dashed box). The central part of the electron spectrum 51 is used, for example, because it provides the largest signal. The obtained dispersion error depends on the width of the window 57 and increases for narrower windows. The data points of FIG. 3B shows the window width dependence of the absolute error of the determined energy dispersion.

For compensating the nonlinearity of the spectrometer dispersion, the FT of the different parts of the electron spectrum 51 was analyzed by sliding the window 57 with a fixed width of a given number of channels that have a low error value, for example, a fixed width of 1000 channels. FIG. 4A shows the average change in channel energy dispersion across the spectrometer 3 and sensor 47. The channel-resolved dispersion is calculated for each window center position, showing an inhomogeneous dispersion across the spectrometer and camera 47. The inset of FIG. 4A displays a window of 1000 channels shifted from the center of the spectrum by 250 channels. The energy dispersion changes across the spectrometer camera 47 with a maximum difference of 0.5 meV. The nonlinearity of the system or spectrometer calibration is thus quantified and a nonlinearity calibration correction can be applied to the spectrometer calibration permitting subsequent correction for the nonlinearity. The absolute error of the calibration remains below 20 μeV/channel as seen in FIG. 4B, which shows the absolute error of the calibration as the function of the window center.

The method of the present disclosure may thus include calculating and/or providing a Fourier transform (FT) of at least one spectral subset or spectral window 57 of the electron energy loss spectrum 51, and determining an energy dispersion ΔE of channels within the at least one spectral subset or spectral window 57. A FT may be calculated and/or provided of a plurality of spectral subsets or spectral windows 57 of the electron energy loss spectrum 51 by displacing the at least one spectral subset or spectral window 57 across the electron energy loss spectrum 51, and determining an energy dispersion ΔE of channels within each of the plurality of spectral subsets or spectral windows 57 to determine an energy dispersion ΔE of a plurality of different regions across the channels of the electron spectrometer 3 or sensor 47. This permits the nonlinearity of the spectrometer calibration across the channels of the spectrometer to be determined and subsequently corrected by applying a non-linearity calibration correction.

The determined (average) change in channel energy dispersion across the spectrometer 3 and sensor 47 is applied as a non-linearity correction for a calibration correction of the determined (average) energy dispersion ΔE determined according to equation 1. The correction is based on the determined energy dispersion ΔE of the plurality of different regions across the channels of the electron spectrometer 3. This permits to define a calibration correction curve or calibration correction data set that is provided to compensate for the nonlinearity of the spectrometer dispersion of the spectrometer 3 and/or sensor 47.

A further aspect of the present disclosure concerns a computer program comprising instructions which, when the program is executed by a computer, cause the computer to carry out the method or method steps described previously.

The computer program may, for example, comprise instructions that, when the program is executed by a computer, cause the computer to calculate a Fourier transform (FT) of at least one electron energy loss spectrum 51 produced by electrons exchanging energy with at least one resonant optical mode of an optical resonator 17 into which light at a resonant wavelength is coupled; and determine an energy dispersion (ΔE) of a transmission electron microscope electron spectrometer (3) determined according to the equation $$\Delta E = f_E \frac{hc}{\lambda N} \text{ or } \Delta E = f_E \frac{E_p}{N}.$$

A further aspect of the present disclosure concerns a computer-readable data carrier having the computer program stored thereon, or a data carrier signal carrying the computer program.

Yet a further aspect of the present disclosure concerns a transmission electron microscope 5 or transmission electron microscope system 1 including the computer program.

Alternatively, the computer program is, for example, included in the calibration device or system 7, or in controller 41.

The transmission electron microscope 5 or the transmission electron microscope system 1 may, for example, also include calculation or computing means or a processor configured to execute and implement the computer program, and may also include a memory (for example, semiconductor memory, HDD, or flash memory) configured to store or storing the computer program. The calculation means or a processor and the memory can be, for example, included in a computer of the transmission electron microscope 5 or the transmission electron microscope system 1, or a portable laptop, or a portable device such as a smart phone. The program or processor executable instructions can be provided, for example, as custom Matlab functions or custom communication protocols. The processor executable instructions are provided to or obtained by the calculation means or processer for execution.

The transmission electron microscope 5 or transmission electron microscope system 1 may further include the calibration device or system 7.

To demonstrate the capabilities of the calibration method of this disclosure, the inventors compare the spectra measured at different resonant wavelengths of the cavity of the optical resonator 17. The cavity resonance at 1549.0 nm was used for calibrating the spectrometer dispersion as described above. Afterward, the inventors tuned the pump laser wavelength to 1540.3 nm, which corresponds to another TM mode of the cavity of the optical resonator 17. At the shorter wavelengths, the Inventors measured the electron energy spectrum and calculated the FT to compare the wavelength estimated through equation (1) with the reference wavelength given by the wavelength meter. The obtained value of 1539.91(26) nm is in excellent agreement with the nominal wavelength of 1540.3 nm, proving the dispersion calibration's high accuracy (FIG. 5A).

The inventors also verified the nonlinearity correction of the method of the present disclosure by comparing dispersion across the CCD camera 47 obtained using a window of 1000 channels for both resonant wavelengths of the cavity (FIG. 5B). These tests corroborate the high precision of the calibration technique.

The method of the present disclosure has important applications in high-resolution EELS, which is fundamental for modern electron microscopy to study low-energy (infrared) excitations, such as phonons. Other applications of EELS include, among others, investigating the chemical composition of a specimen, studying chemical shifts, the electronic structure, and specimen thickness. Calibration of the spectrometer dispersion is fundamental for any EELS system and must be verified periodically. Applications of the present method that permits for a precise and quick calibration of the electron spectrometer dispersion include but are not limited to material science, biology, condensed matter physics, and chemistry; but for both fundamental research and industry.

Further details are now provided in relation to the calibration method, particularly in relation to the Fourier analysis of the electron energy spectra and the formula for the Fourier transform of an electron energy spectrum after the interaction with a near-field is derived.

For a spectrometer with a dispersion of ΔE energy per unit distance, along the dispersed axis x, the measured energy spectrum, I(x), as a result of photon-induced near-field electron microscopy (PINEM) is given by $$I(x) = \sum_{n=-\infty}^{\infty} J_n^2(2|g|)\delta(x - nx_p) * G(x; \sigma_{ZLP}), \tag{S1}$$

The effect of the energy exchange between the electrons and the optical field is represented by a set of subbands with a spacing of:

$$x_p = \frac{hc}{\lambda \Delta E}. \tag{S2}$$

The relative intensity of the nth subband is determined by the prefactor $$J_n^2(2|g|),$$

where g is the coupling strength between the optical field and the electron.

The summation is convolved with a Gaussian function representing the zero-loss peak (ZLP):

$$G(x; \sigma_{ZLP}) \propto \exp(-4\ln2\Delta E^2 x^2/\sigma_{ZLP}^2), \tag{S3}$$

The Gaussian ZLP is parameterised by its full width at half maximum in energy $\sigma_{ZLP}$.

One performs Fourier transform of this function using the convolution theorem, obtaining:

$$\tilde{I}(k) \propto \sum_{n=-\infty}^{\infty} J_n^2(2|g|)\exp\left(in2\pi\frac{hc}{\lambda\Delta E}k\right) \times \exp\left(-\frac{\sigma_{ZLP}^2 k^2}{16\ln 2\ \Delta E^2}\right)$$

The first part of the equation is a summation over harmonic modes where constructive interference occurs only at points satisfying $$k = \frac{\lambda}{hc}\Delta E$$

or integer multiples thereof. This can be rearranged into Equation (1), and is the source of the calibration method. Wide ZLPs lead to weaker peaks, making determining the ΔE less accurate.

In relation to dispersion calculation and deconvolution of the dispersion contribution, as first step for the calibration, the desired window of channels in the EEL spectrum for the calibration was selected. A Fourier transform (FT) of the spectrum within this window was then performed.

To find the peak position $f_E$, the peak was then fitted with a Gaussian function by using the nonlinear least square method.

$f_E$ is estimated as the mean of the fitted Gaussian. The error on the peak position $\delta f_E$ is for example estimated as half of the width of the 95% confidence interval of the mean value. This is given by $t\sqrt{\text{diag}(S)_{f_E}}$·t depends on the confidence level and is obtained from the inverse of the t-Student cumulative distribution. S is the covariance matrix of the fitted parameters, and $\text{diag}(S)_{f_E}$ is the element of its diagonal with the same row coordinate of the mean $f_E$ in the coefficients vector.

Once $f_E$ and $\delta f_E$ are found, one can calculate the dispersion and the relative error with Equation (1) and Equation (2), respectively.

This is, for example, repeated at each 0.5 V step of the drift tube voltage, always using the same group of peaks in the spectrum. At each step, the average dispersion of all the channels is calculated within the selected window. At each step of 0.5 V the window of, for example, 10 channels is shifted. To find the average dispersion of each 10-channel group one deconvolutes the contribution of those 10-channels to the total average dispersion of each step.

The interaction of an electron beam with an optical near field leads to periodic modulation of the longitudinal momentum of the electron beam. This results in the generation of sidebands above and below the zero-loss peak at integer multiples of the optical photon energy in the spectral domain. The precision to which the spectrometer calibration can be achieved is determined by g, with larger values leading to more accurate calibrations. In CW-PINEM, the coupling strength is directly proportional to the optical field strength and the phase-matched interaction length. Using a microresonator 17, very large values of g can be achieved compared to conventional PINEM. This is firstly due to a high Q factor, allowing a high optical power to be stored in the cavity, and secondly due to the extended phase-matched interaction.

The width of the spectrum shown in FIG. 2A is 100 eV, corresponding to around 120 photon sidebands. The estimated value of |g| is ~60. Such strong interaction provides a very narrow FT peak, allowing ultraprecise spectrometer calibration. Moreover, the broad electron spectrum extends over a large part of the CCD camera 47, which allows the characterization of the spectrometer nonlinearity in a single measurement. This method can be extended further by varying the drift tube voltage to shift the center of the spectrum across the full width of the spectrometer camera 47.

The electron energy spectrum shown in this disclosure has been limited by the spread of the unmodulated electron energy spectrum, also known as the zero-loss peak (ZLP) width. The electron gun used in the examples produces a ZLP with a full width at half maximum (FWHM) of 0.8 eV, which is comparable with the photon energy of the cavity. Despite this, the inventors are still able to achieve a calibration precision of 15 μeV.

More recently developed TEMs, equipped with monochromated sources, have energy spreads of ~10 meV. As calibration accuracy increases for a narrower ZLP, a better precision can be achieved, and potentially down to the sub-μeV level. The ability to determine the dispersion of the spectrometer with μeV/ch accuracy and precision and to characterize and correct its nonlinearities are key for high-resolution EELS. Usually, the energy spread of the electron beam is the main limitation to the energy resolution in EELS.

Without monochromators, the FWHM of the ZLP is hundreds of meV, with its tails extending over to a few eV. This large ZLP with extended tails prevents the detection of low-intensity and low-energy-loss peaks in the IR regime (<1 eV). However, in recent years, monochromators and aberration correctors enabled a remarkable improvement of EELS energy resolution. This unprecedented combination of spatial and energy resolution enabled the study of bandgap states and bandgaps, polaritons, excitons, and, more recently, vibrational spectroscopy in electron microscopes. The latter is particularly important since it allows investigating the phenomena related to atomic vibrations such as heat transport. Moreover, it provides information about isotope composition, locally structural features at surfaces and interfaces, single-atom impurities, and allows performing damage-free EELS studies of radiation-sensitive samples such as biological tissues or single organic molecules outside the cryogenic regime, using aloof electron beams.

The method of the present disclosure can be used as a routine technique for calibrating electron spectrometers for high-resolution EELS measurements applicable in all conventional TEMs worldwide. Combining the proposed calibration technique with aberration-corrected monochromated STEM-EELS would enable sub-meV and sub-A energy and spatial resolution, opening new frontiers in the study of low-energy excitations of materials in electron microscopes.

While the invention has been disclosed with reference to certain preferred embodiments, numerous modifications, alterations, and changes to the described embodiments, and equivalents thereof, are possible without departing from the sphere and scope of the invention. Accordingly, it is intended that the invention not be limited to the described embodiments and be given the broadest reasonable interpretation in accordance with the language of the appended claims. The features of any one of the above-described embodiments may be included in any other embodiment described herein.

REFERENCES

[1] Krivanek O L, Lovejoy T C, Dellby N, Carpenter R W. Monochromated STEM with a 30 meV-wide, atom-sized electron probe. Microscopy (Oxf). 2013 February; 62(1): 3-21.

[2] R W H Webster, A J Craven, B Schaffer, S McFadzean, I MacLaren, D A MacLaren, Correction of EELS dispersion non-uniformities for improved chemical shift analysis, Ultramicroscopy, Volume 217, 2020, 113069

[3] P. E. Batson, S. J. Pennycook, L. G. P. Jones, A new technique for the scanning and absolute calibration of electron energy loss spectra, Ultramicroscopy, Volume 6, Issue 3, 1981, Pages 287-289

[4] Potapov P L, Schryvers D. Measuring the absolute position of EELS ionisation edges in a TEM. Ultramicroscopy. 2004 February; 99(1):73-85.

[5] Kothleitner G, Grogger W, Dienstleder M, Hofer F. Linking TEM analytical spectroscopies for an assumptionless compositional analysis. Microsc Microanal. 2014 June; 20(3):678-86.

[6] Egerton, R. F. Electron Energy Loss Spectroscopy in the Electron Microscope. Springer. 3rd ed. New York: 2011.

[7] O. L. Krivanek, N. Dellby, J. A. Hachtel, J.-C. Idrobo, M. T. Hotz, B. Plotkin-Swing, N. J. Bacon, A. L. Bleloch, G. J. Corbin, M. V. Hoffman, C. E. Meyer, T. C. Lovejoy, Progress in ultrahigh energy resolution EELS, Ultramicroscopy, Volume 203, 2019, Pages 60-67

[8] https://www.tedpella.com/technote_html/650%20TN.pdf

[9] J.-W. Henke, A. S. Raja, A. Feist, G. Huang, G. Arend, Y. Yang, J. Kappert, R. N. Wang, M. Möller, J. Pan, J. Liu, O. Kfir, C. Ropers, T. J. Kippenberg, Integrated photonics enables continuous-beam electron phase modulation. arXiv:2105.03729v2 (2021)

[10] M. H. P. Pfeiffer, A. Kordts, V. Brasch, M. Zervas, M. Geiselmann, J. D. Jost, and T. J. Kippenberg, Optica 3, 20 (2016).

[11] J. Liu, G. Huang, R. N. Wang, J. He, A. S. Raja, T. Liu, N. J. Engelsen, and T. J. Kippenberg, Nature Communications 12, 2236 (2021).

The entire contents of each of the above references being fully incorporated herein by reference.

The invention claimed is:

1. An energy dispersion calibration method for calibrating an electron spectrometer of an electron spectrometer system including at least one electron emission source, electron optics and the electron spectrometer, the electron spectrometer system being configured to produce an electron energy spectrum electrons received by the electron spectrometer, the election energy spectrum including a plurality of channels defining an electron energy range the electron energy spectrum, the method comprising:

providing an optical resonator configured to exchange energy with the electrons of the electron spectrometer system;

obtaining, using the electron spectrometer, at least one electron energy loss spectrum produced by electrons of the electron spectrometer system exchanging energy with at least one resonant optical mode of the optical resonator into which light at a resonant wavelength is coupled;

calculating a Fourier transform of the at least one electron energy loss spectrum or a part of the at least one electron energy loss spectrum;

determining an energy dispersion $\Delta E$ of the electron spectrometer according to the equation $$\Delta E = f_E \frac{hc}{\lambda N} \text{ or } \Delta E = f_E \frac{E_p}{N}$$

where $\lambda$ is the resonant wavelength of the light coupled into the optical resonator, h is Planck's constant, c is the speed of light in vacuum, $E_p$ is the resonant photon energy of the light coupled into the optical resonator, N is the number of channels or data points along an energy axis of the at least one electron energy loss spectrum used in determining the Fourier transform of the at least one electron energy loss spectrum or a part thereof, and $f_E$ is the number of reciprocal energy space data points or coordinates between (i) a DC spectral component peak of the Fourier transform of the at least one electron energy loss spectrum or a part thereof and (ii) a sideband peak or a center of a sideband peak of the Fourier transform (FT) of the at least one electron energy loss spectrum or a part thereof, the sideband peak originating from electron energy exchange with the at least one resonant optical mode of the optical resonator, the determined energy dispersion $\Delta E$ defining an incremental energy value of the plurality of channels defining the election energy range of the election energy spectrum or an incremental energy value of a subset of the plurality of channels used to calculate the Fourier transform of the part of the at least one electron energy loss spectrum; and using the determined energy dispersion $\Delta E$ to provide calibrated electron energy spectrum when the electron spectrometer system is used to perform electron spectroscopy.

2. The energy dispersion calibration method according to claim 1, wherein the center of the sideband peak is determined by fitting the sideband peak with a peak fitting function, the center of the sideband peak being determined to be the center of the peak of the fitted peak fitting function.

3. The energy dispersion calibration method according to claim 1, further including determining or providing an accuracy or error value SAE of the energy dispersion AE determined according to the equation $$\delta\Delta E = \sqrt{\left(\frac{\delta f_E}{f_E}\right)^2 + \left(\frac{\delta\lambda}{\lambda}\right)^2} \cdot \Delta E$$

where $\Delta E$ is the energy dispersion, $\delta\lambda$ is an accuracy or error value of the wavelength value or wavelength measurement of the resonant wavelength of the light coupled into the optical resonator $\lambda$, and $\delta f_E$ is an accuracy or error value of a determined center of the side peak $f_E$ of the Fourier transform of the at least one electron energy loss spectrum or a part thereof.

4. The energy dispersion calibration method according to claim 3, wherein the accuracy or error value $\delta f_E$ of a determined position of a center of the side peak is determined as half of the width of a confidence interval of the mean value of the peak fitting function.

5. The energy dispersion calibration method according to claim 4, wherein the confidence interval is set to be between a 90% confidence interval and a 99% confidence interval.

6. The energy dispersion calibration method according to claim 1, further including determining spectrometer or system calibration nonlinearities by calculating or providing a Fourier transform of a plurality of spectral subsets or spectral windows of the at least one electron energy loss spectrum by displacing at least one spectral subset or spectral window across the at least one electron energy loss spectrum, and determining an energy dispersion AE of channels within each of the plurality of spectral subsets or spectral windows to determine an energy dispersion $\Delta E$ of a plurality of different regions across the channels of the electron spectrometer.

7. The energy dispersion calibration method according to claim 6, further including applying a nonlinearity calibration correction to the determined energy dispersion $\Delta E$ of the electron spectrometer, the calibration nonlinearity correction being based on the determined energy dispersion $\Delta E$ of the plurality of different regions across the channels of the electron spectrometer, the nonlinearity calibration correction including a calibration that compensates for nonlinearities of the system.

8. The energy dispersion calibration method according to claim 1, wherein the electron spectrometer system is set at a specific electron energy for exchanging energy between an electron and light propagating in the optical resonator.

9. The energy dispersion calibration method according to claim 8, wherein an electron velocity is matched with a phase velocity of the light resonating in the optical resonator.

10. The energy dispersion calibration method according to claim 9, wherein an alignment of the electron spectrometer system concentrates the electron beam in the vicinity of the optical resonator in which an optical power contained therein creates an electron energy loss spectrum containing a plurality of sideband peaks populating the entire range of the spectrometer energy scale to assure higher precision of dispersion calibration and determination of the spectrometer non-linearities.

11. The energy dispersion calibration method according to claim 10, wherein the electron spectrometer system comprises a transmission electron microscope.

12. The energy dispersion calibration method according to claim 1, further comprising providing an optical device holder configured to hold or holding the optical resonator.

13. The energy dispersion calibration method according to claim 1, further comprising providing a calibration device or system including the optical device holder configured to hold or holding the optical resonator, at least one optical waveguide configured to provide light to the optical resonator, an optical wavelength determiner and a resonance wavelength determiner configured to determine wavelength matching of light coupled to the optical resonator with a resonance wavelength or mode of the optical resonator.

14. The energy dispersion calibration method according to claim 13, further comprising providing at least one light source, at least one controller, at least one processor, and a computer program including program instructions, which when executed by the at least one processor cause the at least one controller to:

adjust a wavelength generated by the at least one light source, monitor or process data or a signal representative of a light intensity signal provided to the optical resonator, and identify or determine a decrease in the light intensity signal or a signature representing a reduction in the optical power representing a resonance condition at which a wavelength of light coupled to the optical resonator matches a resonance wavelength or mode of the optical resonator.

15. The energy dispersion calibration method according to claim 1, wherein the determined energy dispersion $\Delta E$ is used to modify a nominal energy dispersion value of the electron energy spectrum of the electron spectrometer to provide a recalibrated electron energy spectrum when the electron spectrometer system is used to perform electron spectroscopy.

* * * * *